(12) United States Patent
Jamin et al.

(10) Patent No.: US 11,849,018 B2
(45) Date of Patent: Dec. 19, 2023

(54) SYSTEM AND METHOD OF CLOCK RECOVERY WITH LOW PHASE-ERROR FOR CARD EMULATION CLOCK-LESS NFC TRANSCEIVERS

(71) Applicant: NXP B.V., Eindhoven (NL)

(72) Inventors: Olivier Jérôme Célestin Jamin, Sainte Honorine du Fay (FR); Olivier Susplugas, Cambes en Plaine (FR); Olivier Frédéric Guttin, Cormelles le Royal (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/662,918

(22) Filed: May 11, 2022

(65) Prior Publication Data

US 2022/0393851 A1 Dec. 8, 2022

(30) Foreign Application Priority Data

Jun. 2, 2021 (EP) ..................................... 21290036

(51) Int. Cl.
*H03D 3/24* (2006.01)
*H04L 7/033* (2006.01)
(Continued)

(52) U.S. Cl.
CPC ........ *H04L 7/0337* (2013.01); *G06K 7/10297* (2013.01); *H04L 7/0033* (2013.01)

(58) Field of Classification Search
CPC . H04L 7/0337; H04L 7/0033; G06K 7/10297; G06K 7/10237; H03L 7/093
(Continued)

(56) References Cited

U.S. PATENT DOCUMENTS 8,885,788 B1 * 11/2014 Rey .......................... H03L 7/093
375/376
9,281,874 B2    3/2016 Lefley
(Continued)

FOREIGN PATENT DOCUMENTS

EP    2680457 A2    1/2014
EP    2988427 B1    4/2019

OTHER PUBLICATIONS

ISO/IEC 14443-2 "Cards and Security Devices for Personal Identification—Contactless Proximity Objects—Part 2: Radio Frequency Power and Signal Interface"; Fourth Edition, Jul. 2020.

*Primary Examiner* — Phuong Phu

(57) ABSTRACT

Disclosed is a card clock recovery system for use in an NFC card transceiver couplable to an NFC reader. The card clock recovery system has: a phase lock loop having: a phase/frequency detector, which is configured to receive a reference signal provided at an RX port of a matching network during a receiving mode of the NFC transceiver or to receive a reference signal provided at the RX port of the matching network during a transmission mode of the NFC transceiver, to receive a loop feedback signal, and to provide a phase error signal that represents a phase difference between the reference signal and the loop feedback signal; a loop filter configured to receive a corrected phase error signal that is derived from the phase error signal, and to provide a filtered corrected phase error signal; a controllable oscillator, which is configured to receive the filtered corrected phase error signal and to provide a controlled frequency output signal, which is provided as the card clock generation control signal to a card clock generation unit of an NFC card transceiver, and as the loop feedback signal, via the loop feedback line, to the phase/frequency detector. The card clock recovery system further has a phase offset correction unit, which is configured to receive the phase error signal provided by the (Continued)

phase/frequency detector and to provide the corrected phase error signal to the loop filter, and which has a phase error sampling unit, a phase offset computation unit, and a phase subtractor unit.

16 Claims, 7 Drawing Sheets

(51) Int. Cl.
 *G06K 7/10* (2006.01)
 *H04L 7/00* (2006.01)

(58) Field of Classification Search
 USPC ................................ 375/373–376, 326, 327
 See application file for complete search history.

(56) References Cited

U.S. PATENT DOCUMENTS

| | | |
|---|---|---|
| 10,396,975 B2 | 8/2019 | Hung et al. |
| 10,447,350 B2 | 10/2019 | Leow et al. |
| 11,005,534 B2 | 5/2021 | Nunziata et al. |
| 11,099,598 B2 | 8/2021 | Prouet et al. |
| 2010/0197349 A1 | 8/2010 | Morita et al. |
| 2014/0003548 A1* | 1/2014 | Lefley ................ G06K 7/10237 375/259 |
| 2016/0204787 A1 | 7/2016 | Lotfy et al. |
| 2018/0110018 A1 | 4/2018 | Yu et al. |

\* cited by examiner

US 11,849,018 B2

SYSTEM AND METHOD OF CLOCK RECOVERY WITH LOW PHASE-ERROR FOR CARD EMULATION CLOCK-LESS NFC TRANSCEIVERS

CROSS-REFERENCE TO RELATED APPLICATIONS

This application claims priority under 35 U.S.C. § 119 to European Patent Application No. 21290036.9, filed on Jun. 2, 2021, the contents of which are incorporated by reference herein.

TECHNICAL AREA

The present disclosure relates to a card clock recovery system for use in a Near Field Communication (NFC) card transceiver; an NFC card transceiver being for use in communication with an NFC reader device and having such a card clock recovery system; a method of correcting a signal phase of a card clock generation control signal, for example in such a card clock recovery system; as well as a corresponding computer program product and a non-transitory storage medium.

TECHNICAL BACKGROUND

The wide deployment of Near Field Communication (NFC) applications demands for highly integrated, cost-effective manufacturing and operation techniques, including for example effective techniques for providing clock signals. In this respect, a demand leads towards highly integrated, cost-effective new clock recovery techniques with increased performance of such systems in respect notably of reducing the phase error. This may allow to deploy NFC card or card emulation applications without any clock or oscillating crystal in the application.

In NFC applications, a trend has been and continues towards using Active Load Modulation (ALM) transmitters, which allow to increase the NFC communication distance by about one order of magnitude and/or allow to operate with much smaller antennas. Such ALM systems with small antennas require the Card Emulation transmitter phase to be accurately locked to the phase of a reader, with a maximum phase error typically of +/−10°. If this phase accuracy is not achieved, a Card Emulation ALM transmitter cannot interoperate with many world-wide legacy readers, which operate with a single path (non-IQ) receiver.

Next generation NFC applications seek for clock-less Card Emulation ALM transceivers, i.e. transceivers which are able to reach this phase accuracy without any reference clock, that is without any crystal and/or without any external reference clock on the platform. A first aim is to build an extremely low-cost application for the IOT (internet of things) market and/or for the wearable market. A second aim is to be able to perform Card Emulation in so-called "phone off" modes of applications: when the battery is nearly fully depleted, all system clocks are switched off to preserve battery charge as much as possible.

There is thus a need to dispense with the provision and use of clocks and crystals, i.e. to provide clock-less systems. For an NFC card transceiver, this may require to generate a clock from a frequency reference provided by the reader. This can be achieved by phase- and frequency aligning to transitions in a magnetic field e.g. with a phase lock loop (PLL). Such a process is referred to as clock recovery.

Then, given that in an NFC card transceiver the receiver RX and the transmitter TX share the same antenna, one of the key technical challenges to solve for clock-less Card Emulation ALM transceivers is that the card transceiver shall be capable to keep its phase locked to the reader field signal not only during a receiving mode of operation, but also during a transmission mode of operation, that is to say when the card transmitter corrupts the reader phase information, to which a card clock recovery system intends to lock on.

SUMMARY OF THE PRESENT DISCLOSURE

It is a general object of the present disclosure for an NFC card clock recovery system to be enabled to accurately lock on the reader signal phase, not only during a receiving mode of operation, but even during a card transmission mode of operation.

This object is solved by the subjects having the features according to the independent patent claims. In particular, these objects are solved by a card clock recovery system for use in an NFC card transceiver according to the appended independent claim 1, an NFC card transceiver according to the appended independent claim 8, a method of correcting a signal phase of a card clock generation control signal output by an NFC card clock recovery system according to the appended independent claim 10, as well as a computer program product and a non-transitory storage medium according to the appended independent claim 16.

According to a first aspect of the present disclosure, there is provided a card clock recovery system for use in a Near Field Communication (NFC) card transceiver, wherein the NFC card transceiver is couplable to an NFC reader, and wherein the card clock recovery system has a phase lock loop having: (1) a phase/frequency detector (PFD), which is configured to receive a reference signal provided at an RX port of a matching network during a receiving mode of the NFC transceiver or to receive a reference signal provided at the RX port of the matching network during a transmission mode of the NFC transceiver, to receive, via a loop feedback line, a loop feedback signal, and to provide a phase error signal that represents a phase difference between the reference signal and the loop feedback signal; (2) a loop filter configured to receive a corrected phase error signal that is derived from the phase error signal, and to provide a filtered corrected phase error signal; and (3) a controllable oscillator, CO, which is configured to receive the filtered corrected phase error signal (for example as a commanding control input signal) and to provide a controlled frequency output signal, which is provided as the card clock generation control signal to a card clock generation unit of an NFC card transceiver, and as the loop feedback signal, via the loop feedback line, to the PFD. The card clock recovery system further has (4) a phase offset correction unit, which is configured to receive the phase error signal provided by the PFD and to provide the corrected phase error signal to the loop filter.

In an embodiment example of the card clock recovery system, the phase offset correction unit has: (a) a phase error sampling unit, which is configured to receive the phase error signal, to sample one or more phase error signals at one or more first and at one or more second discrete points in time, and to provide one or more sampled phase error signals sampled at the one or more first and the one or more second discrete points in time; (b) a phase offset computation unit, which is configured to receive the one or more sampled phase error signals sampled at the one or more first and at the one or more second discrete points in time, to compute a phase offset signal that corresponds to a difference between at least one sampled phase error signal sampled at a second discrete point in time and at least one sampled phase error signal sampled at a first discrete point in time, and to provide the phase offset signal; and (c) a phase subtractor unit, which is configured to receive the phase error signal provided by the PFD, to receive the phase offset signal provided by the phase offset computation unit, to subtract the phase error signal from the phase offset signal to thereby generate the corrected phase error signal, and to provide the corrected phase error signal, for example to the loop filter.

In an embodiment example of the card clock recovery system, the phase offset computation unit is configured (i) to store a plurality of first phase error signals sampled at plural first discrete points in time, to compute a first average out of these stored first phase error signals sampled at plural first discrete points in time, and to store the first average; (ii) to store a plurality of second phase error signals sampled at plural second discrete points in time, to compute a second average out of these stored second phase error signals sampled at plural second discrete points in time, and to store the second average; and (iii) to compute a difference between the second average and the first average, and to provide this difference as the phase offset signal, for example to the phase subtractor unit.

In an embodiment example of the card clock recovery system, the phase offset computation unit further has (d) a phase offset finite state machine, which is configured to output: (I) a first state control signal to be received by the phase error sampling unit for controlling (a) the timing of the one or more first discrete points in time and (b) the timing of the one or more second discrete points in time; (II) a second state control signal to be received by the phase offset computation unit for (c) controlling the timing of the storing of the one or more first phase error signals sampled at the one or more first discrete points in time, and for example the computing of the first average out of these stored first phase error signals, for (d) controlling the timing of the storing of the one or more second phase error signals sampled at the one or more second discrete points in time, and for example the computing of the second average out of these stored second phase error signals, and for (e) controlling the timing of the computing of the difference between the second average and the first average; and (III) a third state control signal to be received by the loop filter for controlling a control input of the controlled oscillator such that the control input of the controlled oscillator is frozen when the third state control signal is set to be TRUE.

In an embodiment example of the card clock recovery system, the phase offset finite state machine has: (i) a first control signal input configured to receive a first control signal that controls an activation of a card transmitter driver; (ii) a second control signal input configured to receive a second control signal that controls an activation period of the modulation of the card transmitter driver for generating a modulated output voltage signal that represents an encoded symbol to be transmitted by the card transmitter; and (iii) a third control signal input configured to receive a third control signal that controls the timing of the sampling of the one or more first phase error signals sampled at the one or more first discrete points in time, and for example the computing of the first average of these stored first phase error signals, and the timing of the sampling of the one or more second phase error signals sampled at the one or more second discrete points in time, and for example the computing of the second average of these stored second phase error signals.

In an embodiment example of the card clock recovery system, the system further has (iv) a fourth control signal, which corresponds to the third state control signal and is to be received by the loop filter for controlling the control input of the controlled oscillator, wherein the control input of the controlled oscillator is frozen when the fourth control signal is set to be TRUE.

In an embodiment example of the card clock recovery system, the one or more first discrete points in time are while the card transceiver operates in a receiving mode, or while the card transceiver receives a continuous wave, CW, emission from an NFC reader, to which the NFC transceiver is coupled, during a transmission mode of the card transceiver; and the one or more second discrete points in time are while the card transceiver operates in a transmitting mode and towards the ends of respective symbol transmission periods.

In an embodiment example of the card clock recovery system, the system has at least one of the following features:
(1) the controllable oscillator is one of a digitally controlled oscillator, DCO, or a voltage controlled oscillator, VCO;
(2) the phase lock loop further has, a feedback divider provided in the loop feedback line, wherein the feedback divider is configured to divide the frequency of the loop feedback signal;
(3) the loop filter is configured to integrate over time and/or to amplify by a proportionality factor the received corrected phase error signal so as to thereby generate the provided filtered corrected phase error signal.

According to a second aspect of the present disclosure, there is provided an NFC card transceiver for use in communication with an NFC reader, wherein the NFC transceiver has a card antenna, a card matching network, a card receiver, a card transmission controller, a card transmission driver, a card clock recovery system according to the first aspect of the present disclosure, and a card clock generation unit. The card matching network is coupled to the card antenna, is configured to output a receiver, RX, input signal at an RX port of the matching network, which RX input signal is generated during a receiving mode of the NFC transceiver, for example while the NFC transceiver receives a continuous wave, CW, emission from an NFC reader, to receive a transmission, TX, output signal at a TX port of the matching network, which TX output signal is generated during a transmission mode of the NFC transceiver. The card receiver is configured to receive the RX input provided at the RX port of the matching network, and to receive a receiver clock signal from the card clock generation unit. The card transmission controller is configured to output a card transmission control signal. The card transmission driver is configured to receive the card transmission control signal, to receive a transmission clock signal, and to provide the TX output signal to the TX port of the card matching network. The card clock recovery system is configured to either receive the RX input signal provided at the RX port during a receiving mode of the NFC transceiver or to receive the RX input signal during a transmission mode of the NFC transceiver, and to provide a card clock generation control signal to the card clock generation unit. The card clock generation unit is configured to receive the card clock generation control signal from the card clock recovery system, to provide the receiver clock signal to the card receiver, and to provide the transmission clock signal to the card transmission driver.

In an embodiment example of the NFC card transceiver, the NFC transceiver is one of a clock-less transceiver, or an NFC transceiver does not have a reference clock unit or an oscillatory crystal.

According to a third aspect of the present disclosure, there is provided a method for correcting a signal phase of a card clock generation control signal, which is generated as an output of a card clock recovery system of an NFC transceiver and is configured for being received by a card clock generation unit of an NFC transceiver. Herein, the card clock recovery system has a phase/frequency detector, PFD, a loop filter, a controllable oscillator, CO, and a phase offset correction unit. The method has: (i) receiving, at a reference input of the PFD, a reference input signal; (ii) receiving, at a feedback input of the PFD, a loop feedback signal; (iii) generating, at an output of the PFD, a phase error signal that represents a phase difference between the reference signal and the loop feedback signal; (iv) generating, by the phase offset correction unit, a phase offset signal and subtracting the phase error signal from the phase offset signal so as to thereby provide a corrected phase error signal; (v) receiving, by the loop filter, the corrected phase error signal, filtering, in the loop filter, the corrected phase error signal so as to provide a filtered corrected phase error signal; (vi) receiving, by the controllable oscillator, the filtered corrected phase error signal, commanding therewith the controllable oscillator so as to provide, by the controlled oscillator, a controlled frequency output signal; (vii) providing the controlled frequency output signal as the loop feedback signal to the PFD; and (viii) providing the controlled frequency output signal as the signal phase corrected card clock generation control signal, to the card clock generation unit of the NFC transceiver.

In an embodiment example of the method, the phase offset correction unit of the NFC transceiver further has a phase error sampling unit, a phase offset computation unit, and a phase subtractor unit. Herein, generating the phase offset signal further comprises: sampling the phase error signal, by the phase error sampling unit, at one or more first discrete points in time and at one or more second discrete points in time; computing, by the phase offset computation unit, a phase offset signal that is obtained as a difference between a phase error signal sampled at a second discrete point in time and a phase error signal sampled at a first discrete point in time; and subtracting, by the phase subtractor unit, the phase error signal from the phase offset signal so as to thereby provide the corrected phase error signal, to the loop filter.

In an embodiment example of the method, the method further has, in the phase offset computation unit: (i) storing a plurality of first phase error signals sampled at plural first discrete points in time, computing a first average out of these stored first phase error signals sampled at plural first discrete points in time, and storing the first average; (ii) storing a plurality of second phase error signals sampled at plural second discrete points in time, computing a second average out of these stored second phase error signals sampled at plural second discrete points in time, and storing the second average; and (iii) computing a difference between the second average and the first average, and providing this difference as the phase offset signal, to the phase subtractor unit.

In an embodiment example of the method, the phase offset correction unit further has a phase offset finite state machine. Herein, the method further has: (I) providing, by the phase offset finite state machine, a first state control signal to the phase error sampling unit for (a) controlling the timing of the one or more first discrete points in time and (b) the timing of the one or more second discrete points in time; (II) providing, by the phase offset finite state machine, a second state control signal to the phase offset computation unit for (c) controlling the timing of the storing of the first phase error signals sampled at the one or more first discrete points in time, and for example the computing of the first average out of these stored first phase error signals, for (d) controlling the timing of the storing of the one or more second phase error signals sampled at the one or more second discrete points in time, and for example the computing of the second average out of these stored second phase error signals, and for (e) controlling the timing of the computing of the difference between the second phase error signal and the first phase error signal, or for example the difference between the second average and the first average; and (III) providing, by the phase offset finite state machine, a third state control signal to be received by the loop filter for controlling a control input of the controlled oscillator such that the control input of the controlled oscillator is frozen when third state control signal is set to be TRUE.

In an embodiment example of the method, the method further has, in the phase offset finite state machine: (i) receiving, for example at a first control signal input of the finite state machine, a first control signal that controls an activation of a card transmitter driver; (ii) receiving, for example at a second control signal input of the finite state machine, a second control signal that controls an activation period of the modulation of the card transmitter driver for generating a modulated output voltage signal that represents an encoded symbol to be transmitted by the card transmitter; and (iii) receiving, for example at a third control signal input of the finite state machine, a third control signal that controls the timing of the sampling of the one or more first phase error signals sampled at one or more first discrete points in time, and for example the computing of the first average of these stored first phase error signals, and the timing of the sampling of the one or more second phase error signals sampled at one or more second discrete points in time, and for example the computing of the second average of these stored second phase error signals.

In an embodiment example of the method, the method further has controlling the control input of the CO by a fourth control signal, which corresponds to the third state control signal and is be received by the loop filter, wherein the control input is frozen when the fourth control signal is set to be TRUE.

In an embodiment example of the method, the one or more first discrete points in time are while the card transceiver operates in a receiving mode, or while the card transceiver receives a continuous wave, CW, emission from an NFC reader, to which the NFC transceiver is coupled, during a transmission mode of the card transceiver; and the one or more second discrete points in time are while the card transceiver operates in a transmission mode and towards the ends of respective symbol transmission periods.

According to a fourth aspect of the present disclosure, there is provided a machine-readable, non-transitional storage medium storing a computer program product, or a computer program product, which comprises instructions, which when executed on a data processing system, such as a processor, a micro-processor, or a computer, control or execute the method according to the third aspect of the present disclosure.

BRIEF DESCRIPTION OF THE DRAWINGS

In the following, exemplary embodiment examples of the present disclosure are described in detail with reference to the appended drawings, in which.

For reasons of conciseness, features, which will be described with respect a particular figure, may not be described again, if they appear likewise or similarly in another figure.

DETAILED DESCRIPTION

Before exemplary embodiment examples of the present disclosure are described with reference to the figures (namely FIGS. 7 to 10), some background and specific aspects of this disclosure as proposed by the present inventors shall still be explained.

In NFC applications, a trend has been and continues to lead to Active Load Modulation (ALM) transmitters. These allow to increase the NFC communication distance by one order of magnitude and/or allow to operate with much smaller antennas. On the other hand, such use requires a card or a Card Emulation transmitter phase to be accurately locked to the reader phase, with a maximum phase error of +/−10°. If this accuracy is not achieved, a Card Emulation ALM transmitter cannot interoperate with many world-wide legacy readers, which operate with a single signal path and non-IQ signal processing.

Figure 1:
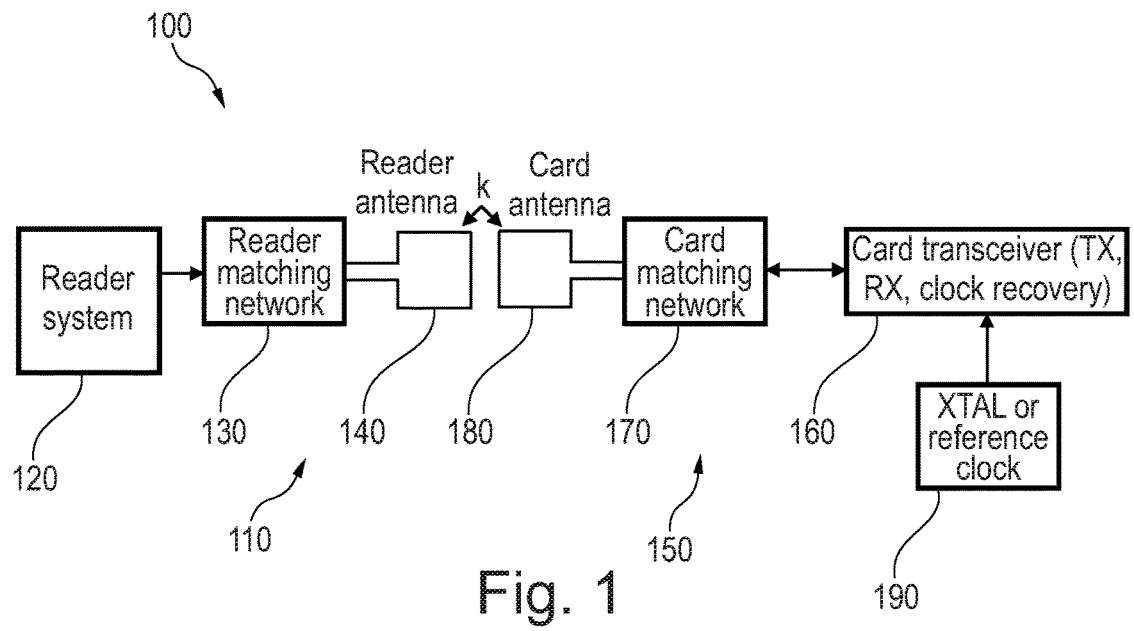
FIG. 1 shows a schematic block diagram of a conventional NFC communication system having an NFC reader and an NFC card transceiver, which has a reference clock and/or an oscillatory crystal.

FIG. 1 shows a schematic block diagram of a conventional NFC communication system 100 having an NFC reader 110 and an NFC card transceiver 150, which has a reference clock 190 and/or an oscillatory crystal. More in particular, the NFC reader 110 in a conventional design has a reader system 120 that issues and receives requests and data, a reader matching network 130 that transforms signals representing requests and data as used by the reader system 120 to radio frequency (RF) signals that can be transmitted to or received from the reader antenna 140. The NFC card transceiver 150 in a conventional design has a card transceiver 160 that is capable to operate in a receiving (RX) mode and in a transmitting (TX) mode for receiving and transmitting data, a card matching network 170 that transforms signals representing data as used by the card transceiver 160 to RF signals that can be transmitted to or received from the card antenna 180. When the card antenna 180 is in sufficiently close proximity, i.e. within a so-called coupling distance, to the reader antenna 140, a magnetic coupling (represented in FIG. 1 by the coupling factor k) occurs between the magnetic field of the reader antenna 140 and the magnetic field of the card antenna 180, which allows the card antenna 180 to sense and receive RF signals from the reader antenna 140 and to transmit RF signals to the reader antenna 140, and vice versa. The digital circuits in the card transceiver 160 are conventionally synchronized by clock signals provided a reference clock 190 and/or an oscillatory crystal 190, and may further have a card clock recovery system for recovering a clock signal from a periodic signal received via the card antenna 180 and through the card matching network 170.

The wide deployment of NFC applications requests highly integrated, cost-effective new clock recovery techniques. The present disclosure describes a system and a method allowing to improve the performance of clock recovery systems in that they result in a reduced phase error, without necessity of any clock or crystal in the application.

Figure 2:
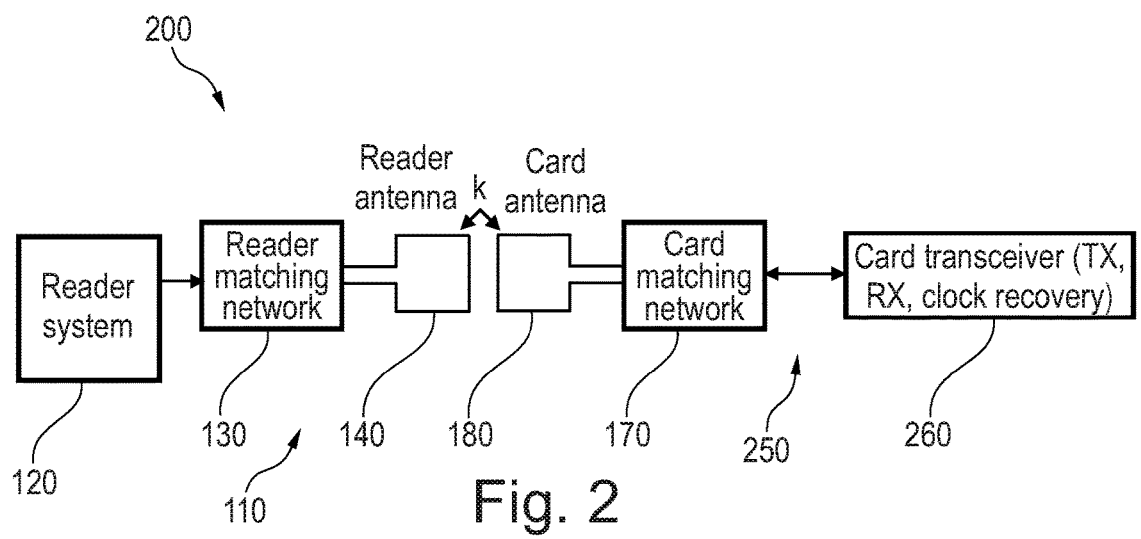
FIG. 2 shows a schematic block diagram of an NFC communication system having a conventional NFC reader and a clock-less NFC card transceiver.

FIG. 2 shows a schematic block diagram of a NFC communication system 200 having a conventional NFC reader 110 (as in FIG. 1) and a clock-less NFC card transceiver 250. The clock-less NFC card transceiver 250 of FIG. 2 has a card antenna 180 and a card matching network 170 like those in the conventional NFC card transceiver 150 of FIG. 1, while the card transceiver 260 of FIG. 2 differs from the card transceiver 160 of FIG. 1 in that the card transceiver 260 does not have any clock or crystal, i.e. is clock-free, and relies on a clock recovery technique that is provided in the clock-less card transceiver 260 and that is capable to lock in to a clocked signal that is received in the card transceiver 260 via the card antenna 180 and the card matching network 170.

Next generation NFC applications seek for ALM clock-less transceivers, like the card transceiver 260 of FIG. 2, which are capable to achieve the required phase accuracy without any reference clock, i.e. neither a crystal nor a reference clock available on the platform. Such design allows (i) to build extremely low-cost applications for the internet of things (TOT) market and/or the wearable market, and/or (ii) to be able to perform Card Emulation in so-called "phone-off" modes of operation, i.e. when the battery is nearly fully depleted, all system clocks are switched off to preserve battery charge.

When a NFC card or Card Emulation transceiver 160, 260 is with its card antenna 180 within the coupling distance to the antenna 140 of an NFC reader 110, and hence a coupling (represented in FIG. 2 by the coupling factor k) between the card antenna 180 and the reader antenna 140 is established, a two-way communication can be established between the NFC reader 110 and the NFC card transceiver 150. Such two-way communication proceeds according to established standards, for example ISO14443.

Figure 3:
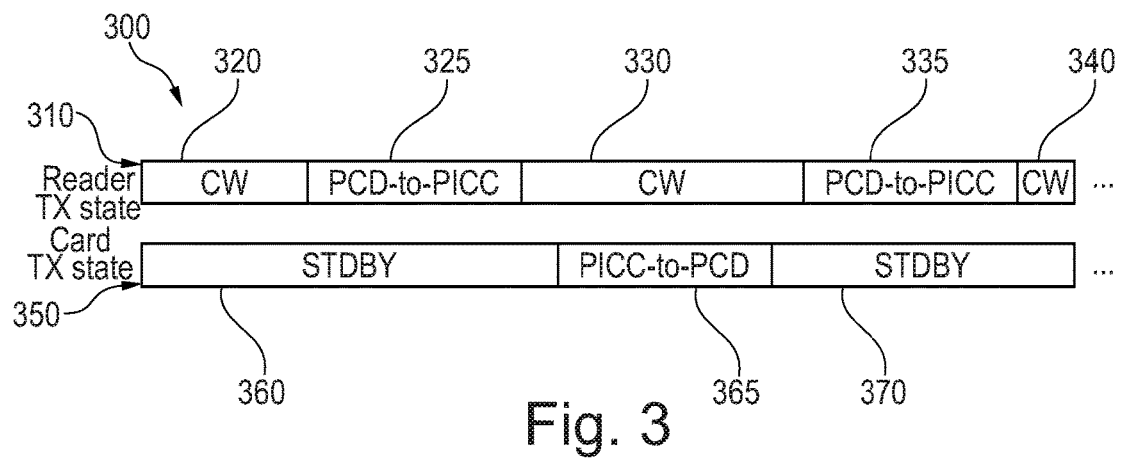
FIG. 3 shows a communication example involving an NFC reader as a proximity coupling device (PCD) and an NFC transceiver as a proximity inductive coupling card (PICC), according to ISO14443.

FIG. 3 shows a communication example involving an NFC reader 110 as a proximity coupling device (PCD) and an NFC transceiver 160, 260 as a proximity inductive coupling card (PICC), according to ISO14443. In FIG. 3, the communication for a typical transaction has started in that the NFC reader 110 assumes a transmission (TX) state and sends an unmodulated periodic signal to produce by the reader antenna 140 an unmodulated periodic magnetic field, i.e. a continuous wave (CW) transmission 320, while the card transceiver 160, 260 is in a standby state 360. The NFC reader 110 proceeds and sends data frames destined for the NFC card transceiver 160, 260, in the format of PCD-to-PICC frames 325, which will cause the NFC card transceiver 160, 260 to answer to the NFC reader 110. Accordingly, the NFC reader 110 stops transmitting PCD-to-PICC frames 325 and starts to wait for the NFC transceiver 160, 260 to answer.

The NFC transceiver 160, 260 answers by starting to transmit data frames destined for the NFC reader 110, in the format of PICC-to-PCD frames 365, while the NFC reader 110 is in a state of continuous wave (CW) transmission 330. It is noted that the NFC reader 110 is in the state of CW transmission 330 before the NFC card transceiver 160, 260 starts transmitting PICC-to-PCD frames 365, and also until after the NFC card transceiver 160, 260 has stopped transmitting PICC-to-PCD frames 365.

Then, the NFC transceiver 160, 260 returns to a standby state 370, and the NFC reader 110 stops its CW transmission 330 and resumes transmitting PCD-to-PICC frames 335, while the NFC transceiver 160, 260 listens and remains in its standby state 370.

A frame (PCD-to-PICC, or PICC-to-PCD) can be as long as 20 ms, and a full transaction can last a few seconds. The duration of a PICC-to-PCD frame 365 forces the clock-less NFC card transceiver 250 to perform clock recovery during this PICC-to-PCD frame 365 in order to ensure an accurate phase synchronization with the NFC reader 110.

Given that in the NFC transceiver 250 both the receiving and the transmission mode of operation share the same card antenna 180, one of the key technical challenges to solve for a clock-less card or Card Emulation ALM transceiver 260 (as shown in FIG. 2) is that the it must be able to keep its phase locked to the reader field during the whole card transmission PICC-to-PCD 365. That is to say, the card transmitter corrupts, in the card antenna 180 and the card matching network 170, the reader phase information (from the reader CW transmission 330) that the card clock recovery intends to lock on.

The initial phase of the card mode transmitter is subject to a complex optimization process in order to ensure worldwide interoperability, and thus cannot be assumed to be equal to (or 180° from) the reader phase. For example, EP 2 988 427 A1 discloses a method for a phase calibration in a frontend circuit of an NFC tag device.

The present disclosure provides a solution for a card clock recovery system in an NFC card transceiver 260 (see FIG. 2), 450 (see FIG. 4), in particular for a Card Emulation ALM transceiver, to accurately lock on a phase of a signal 330 (see FIG. 3) of an NFC reader 110, 410, even during a card transmission mode of operation.

Figure 7:
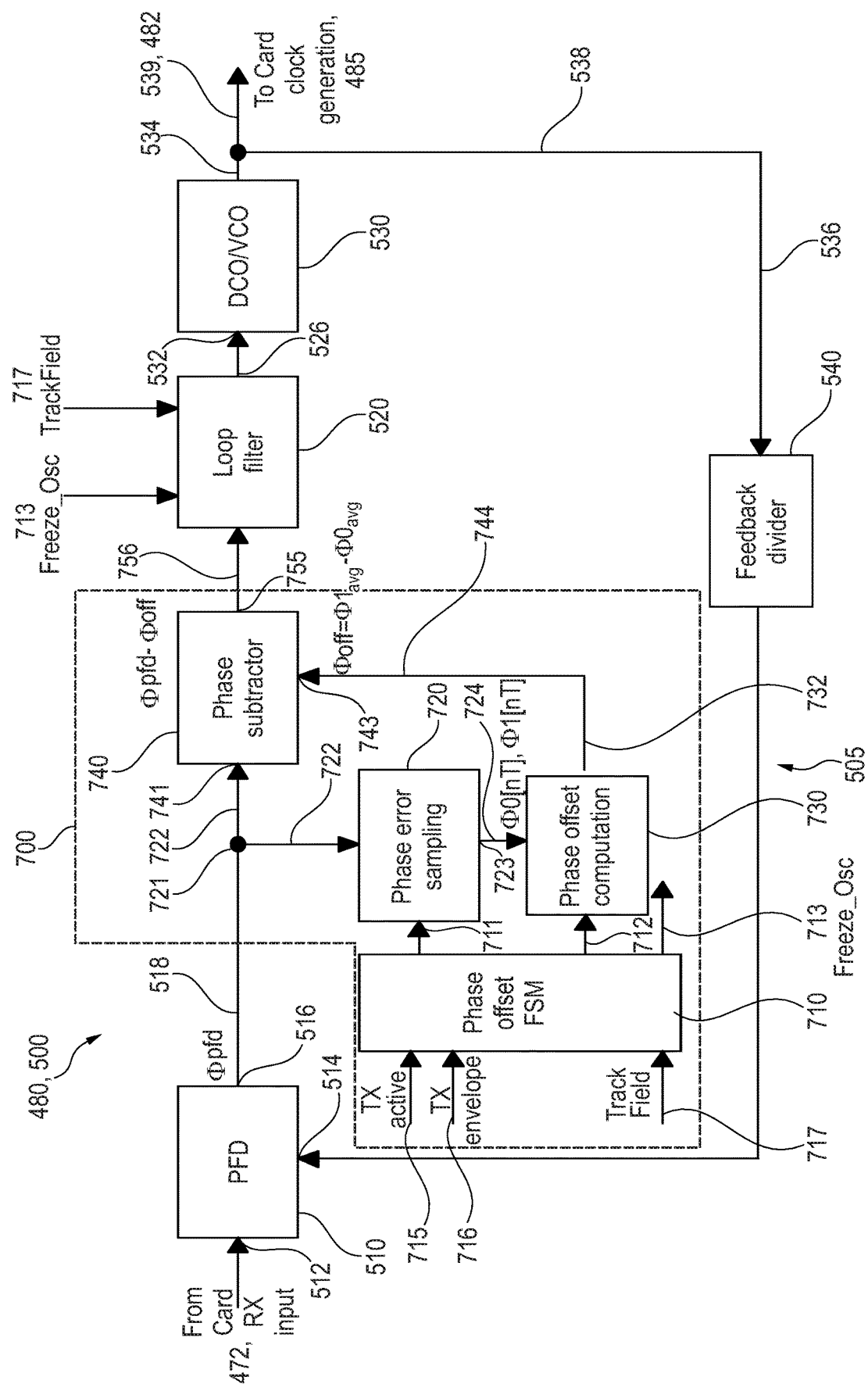
FIG. 7 shows a schematic block diagram of a card clock recovery system, which has a phase offset correction unit that is capable to remove the matching network memory effect, according to the present disclosure.

The novel system and method of clock recovery according to this disclosure is embedded in a card clock recovery system 480 (see FIG. 4) and 500 (see FIG. 5) as shown in FIG. 7. The novel card clock recovery system 480, 500 as shown in FIG. 7 is embedded in a phase lock loop (PLL) 505, such as the PLL 505 shown in FIG. 5, which locks in the phase and the frequency of an NFC reader 410. The context for operation of the novel card clock recovery system 480, 500 is shown in FIG. 4.

Figure 4:
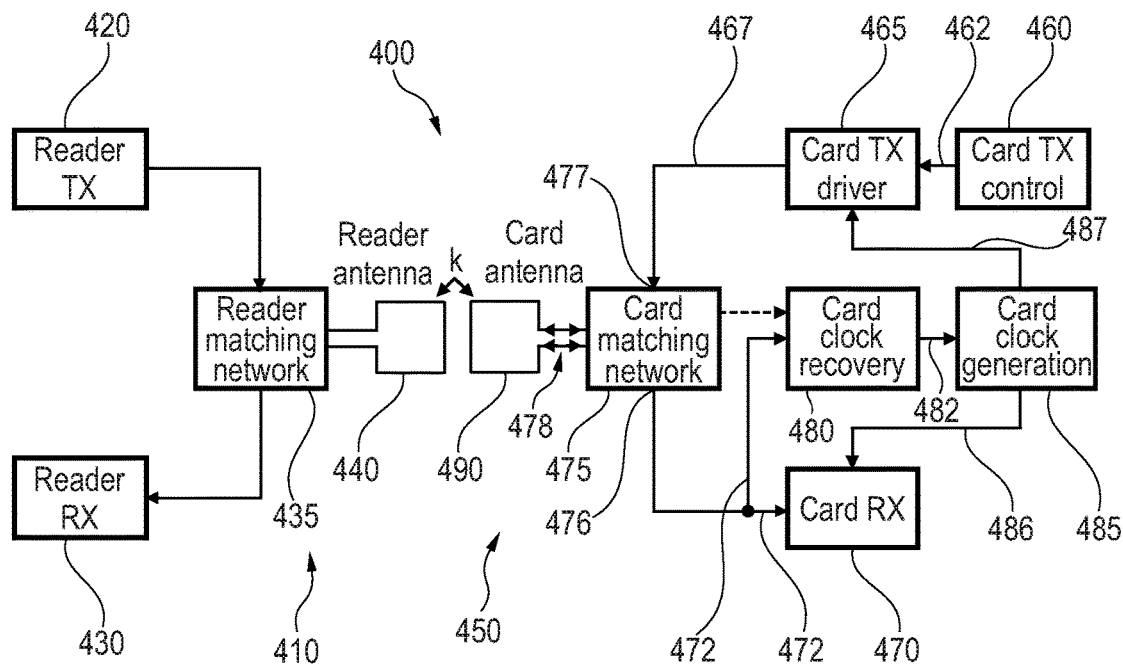
FIG. 4 shows a schematic block diagram of an NFC communication system having an NFC reader and a clockless NFC card transceiver having a card clock recovery system according to an exemplary embodiment of the present disclosure.

FIG. 4 shows a schematic block diagram of an NFC communication system 400 having an NFC reader 410 and a clock-less NFC card transceiver 450 having a card clock recovery system 480 according to an exemplary embodiment of the present disclosure.

Figure 6:
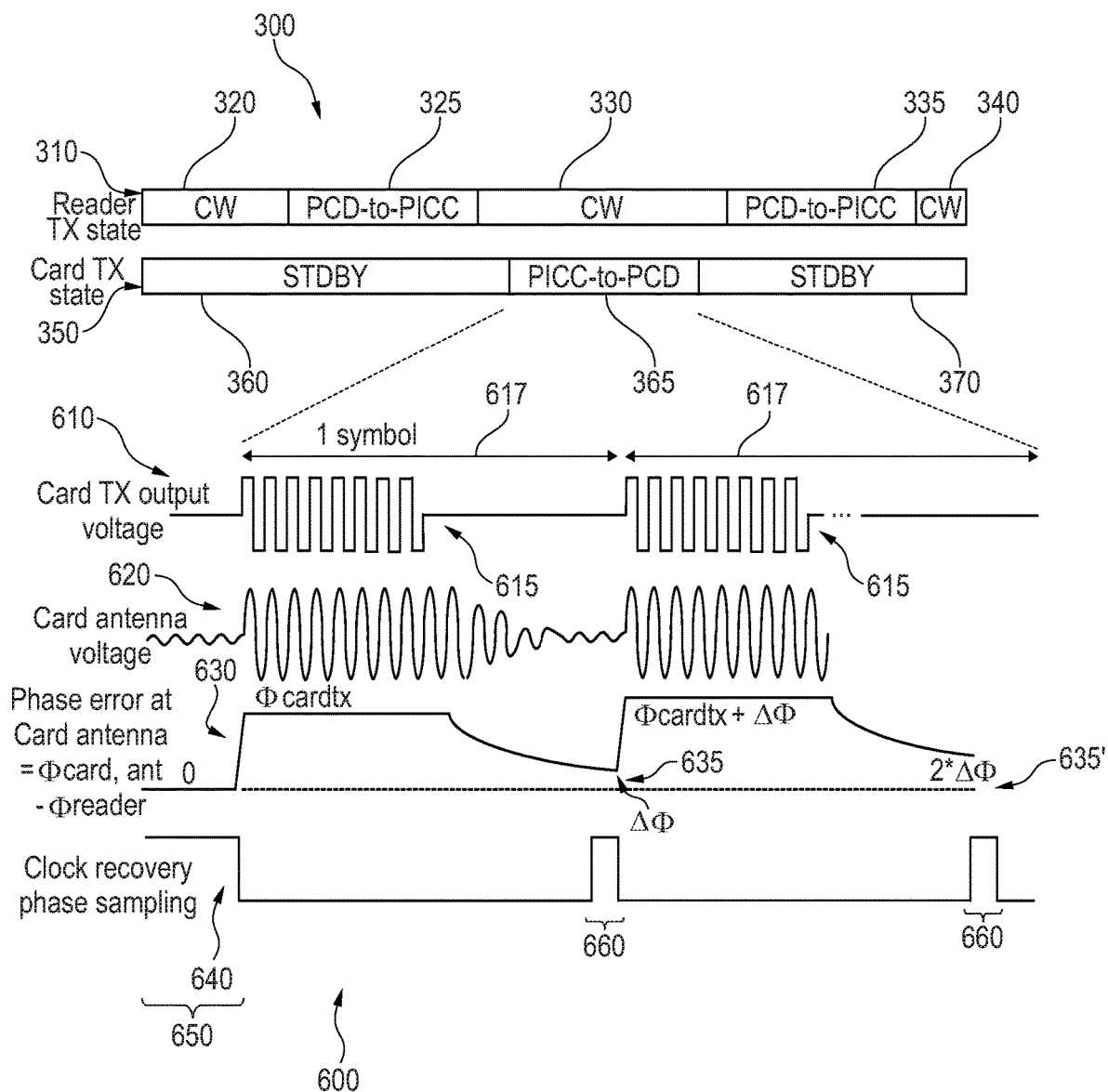
FIG. 6 shows a schematic chronogram of a conventional card clock recovery method, wherein a phase error of the clock recovery principle is increasing due to the matching network memory effect, hence leading to a divergence of the clock recovery.

In operation of the NFC communication system 400 shown in FIG. 4, the NFC reader 410 is the master, and as such provides a 13,56 MHz magnetic field (CW signal 330 as shown in FIGS. 3 and 6) through the reader matching network 435 and through the reader antenna 440. Via the magnetic coupling k (see FIG. 4), this signal enters the NFC transceiver 450 via the card antenna 490 and the card matching network 475 (see the RX signal 476 in FIG. 4), and arrives as the RX input signal 472 at the card receiver (RX) 470 and at an input of the card clock recovery system 480.

The card clock recovery system 480 locks to the frequency and phase of the incoming field (CW signal 330), thereby defines the reference clocks for the card transceiver 450, and provides an according card clock generation control signal 482 to a card clock generation unit 485. The latter in turn provides the proper receiver clock signal 486 to the card RX 470 and the proper card transmission clock signal 487 to the card transmission (TX) driver 465.

As an example, for an NFC transceiver 450 IC using a pulse width modulation (PWM) class-D transmitter (TX), the card clock recovery system 480 might provide multiple high-frequency reference clock signals, i.e. 8 phases at 650 MHz. The TX clock generation (as a part of the card clock generation unit 485) includes according frequency dividers and digital logic to build PWM signals from the high-frequency clocks. The RX clock generation (as another part of the card clock generation unit 485) might include frequency dividers from 7,8 GHz down to 13,56 MHz to a few hundreds MHz.

Figure 5:
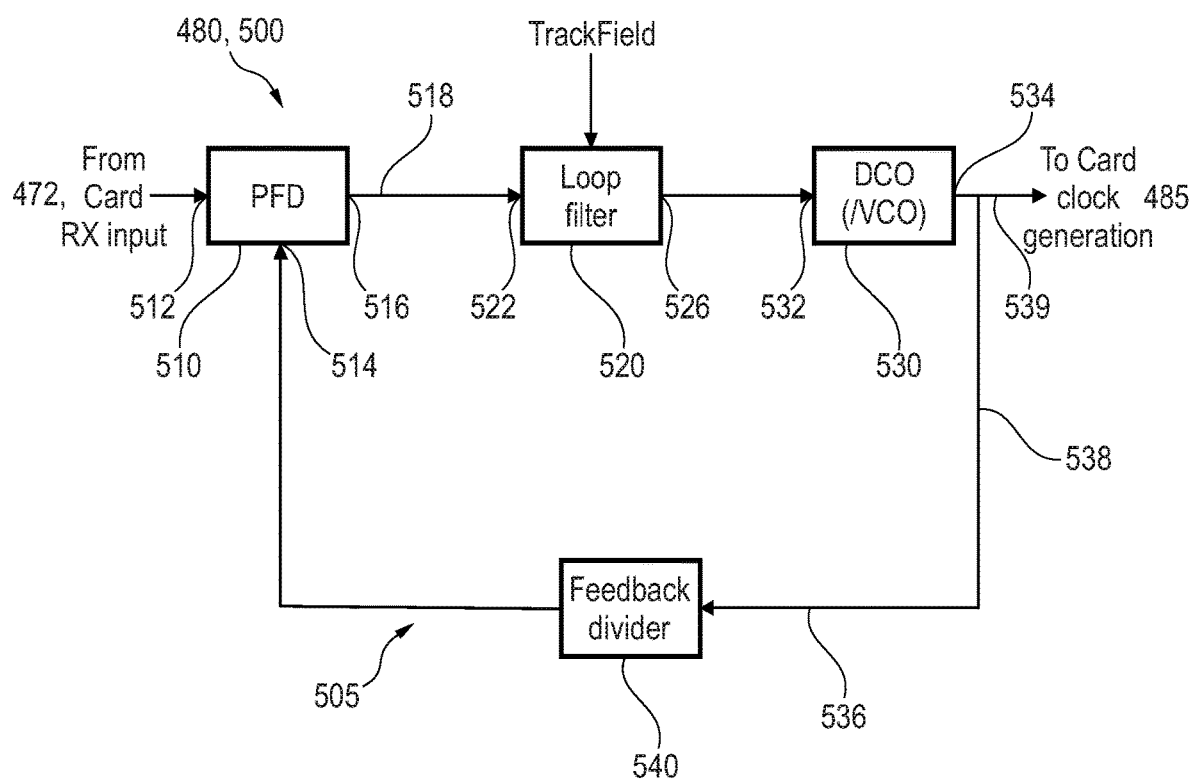
FIG. 5 shows a schematic block diagram of a card clock recovery system, which forms the basis for the novel card clock recovery system according to an exemplary embodiment of the present disclosure.

With reference to FIG. 5, in brief, the card clock recovery system 480, 500 is based on a phase lock loop (PLL) 505 and has: a phase/frequency detector (PFD) 510, a loop filter 520, a controllable oscillator 530, and a feedback line 536 comprising an optional feedback divider 540.

FIG. 5 shows a schematic block diagram of a card clock recovery system 500, which forms the basis for the novel card clock recovery system according to an exemplary embodiment of the present disclosure (as shown in FIG. 7).

In operation, the PLL 505 locks the phase of its internal controllable oscillator 530 to the CW field signal 330 of the NFC reader 410 by sensing the RX input signal 472 from time to time during the receiving mode of operation of the NFC transceiver 450. The points in time for sensing the RX input signal 472 are defined by the control signal, which is herein called TrackField, when set to 1 (TrackField=1) during the RX mode at first discrete points 650 in time (see FIG. 6). The points in time for sensing the TX output are defined by the control signal TrackField=1 at second discrete points 660 in time, which are between transmission (TX) bursts 615 (see also FIG. 6). At these instants in time (i.e. at the first points 650 in time during RX mode and at the second points 660 in time during TX mode), the PFD 510 compares the phase of the internal oscillator 520 (feedback signal 538), optionally divided by the feedback divider 540, with the phase of the reader field, CW signal 330 (reference signal 512), and generates an output signal 518 that is indicative of a phase difference, also called phase error, between the loop feedback signal 538 and the reference signal 512. The phase error signal 518 is integrated in the loop filter 520, which outputs a filtered phase error signal 526 that commands (or controls) the internal oscillator 530. The controllable oscillator 530 may be embodied as a digitally controlled oscillator (DCO), or as a voltage-controlled oscillator (VCO). The circuit representation of the so-operating PLL 505 is shown in FIG. 5, while an associated chronogram with signals and control signals is shown in FIG. 6.

FIG. 6 shows a schematic chronogram of a conventional card clock recovery method, wherein a phase error ($\Delta\Phi$ at 635) of the clock recovery principle is increasing from one TX burst to the next ($\Delta\Phi$ at 635, 2*$\Delta\Phi$ at 635', ... ) due to the matching network memory effect, hence leading to a divergence of the clock recovery.

In this form, as described above and illustrated in FIG. 6, the card clock recovery system 500 locks ideally to the reader phase during the reader unmodulated (CW) field emission 330, but fails to maintain this accurate phase when the card transmitter 460, 465 is transmitting. This is due to the corruption of the phase of the card antenna 490 by the NFC transceiver's 450 own transmitter 460, 465 during the card transmission, and because of the relatively high quality factor ($Q\approx 8$-12) of the card antenna. The voltage and phase at the card antenna 490 during TX transmission bursts 615, after the end of a TX burst, need time to converge back to the voltage and phase corresponding to the reader unmodulated (CW) field emission 330. This time may not be sufficient so that a remainder $\Delta\Phi$ (see at 635 in FIG. 6) of the phase error at the card antenna 490 remains after a first TX burst and cannot converge back fully after the TX burst. Then, after a second TX burst, there remains a remainder 2*$\Delta\Phi$ (see at 635' in FIG. 6) of the phase error at the card antenna 490, and so on. In this patent application, this effect is referred to as the <u>matching network memory effect</u> of the card matching network 475.

This matching network memory effect prevents the clock recovery to sample accurately the reader phase ($\Phi$Reader). In fact, the clock recovery samples, at the points 660 in time, a mixture of the reader phase ($\Phi$Reader) and the card transmitter phase ($\Phi$CardTX), which leads to an overall phase that is equal to $\Phi$Reader+$\Delta\Phi$ (see FIG. 6). This effect can even result in a de-lock (or divergence) of the PLL 505 (possibly causing to wrong phase, a wrong frequency of card clock recovery, see FIG. 6 during the points 660 in time), which may lead to a non-functional system.

The matching network memory effect gets even worse, when the NFC communication system 400 operates near sensitivity, when the card transceiver 450 transmits its maximum power to the reader 410, and the reader signal, as perceived at the card antenna 490, is the weakest. Then, the perceived phase at the card antenna 490 is the most polluted by the card's 450 own transmitter 460, 465.

The teaching of the present disclosure aims to correct and/or compensate the card transmitter phase for the matching network memory effect during card transmission operations, and thereby make it possible to maintain a small phase error even during the transmission phase of a card transceiver and to improve the performance of a card clock recovery system in respect of the matching network memory effect.

According to the teaching, in brief, with reference to FIGS. 7, 8, and 9, and as will be explained in more detail further below, a card clock recovery system 500 comprises a PLL (phase locked loop) 505 having a phase/frequency detector (PFD) 510, a loop filter 520, a controllable oscillator 530 (e.g. DCO or VCO), and an optional feedback divider 540, and in addition a phase offset correction unit 700 coupled in the PLL 505 between the PFD 510 and the loop filter 520.

Still in brief, in operation:

(1) the card clock recovery system, using the PLL 505, locks accurately to the phase of the reader signal arriving at the input 512 of the PFD 510 during the reader CW transmission 330. The output of the PLL PFD 510 is monitored, and stored after averaging. At the end of a reader CW transmission 330, the stored phase is $\Phi 0_{,avg}$.

(2) When the card transmitter 460, 465 starts transmitting (for example a symbol 617 in the card TX output driver voltage 610 (see FIG. 6), 467 (see FIG. 4), towards the end of a symbol transmission, the PLL PFD 510 output is evaluated ($\Phi 1_{,avg}$).

(3) From this instant in time, a constant phase offset ($\Phi\text{off}=\Phi 1_{,avg}-\Phi 1_{,avg}$) is subtracted from the signal 518 at the output 516 of the PFD 510: $\Phi\text{pfd\_corr}(nT)=\Phi\text{pfd}(nT)-\Phi\text{off}$.

Now, in more detail, with reference to FIG. 7, aiming to compensate for the matching network memory effect, a card clock recovery system 500 as shown in FIG. 5 is provided with a phase offset correction unit 700, as shown in FIG. 7. The phase offset correction unit 700 comprises a phase offset finite state machine 710, a phase error sampling unit 720, a phase offset computation unit 730, and a phase subtractor unit 740.

The phase offset correction unit 700 operates as follows:

During the unmodulated (CW) field emission 330 of the reader 410, the phase error sampling unit 720 samples the output signal 518 of the PFD 510. The phase offset computation unit averages out several samples of the PFD output, and stores it ($\Phi 0_{,avg}$, $\Phi 0_{,avg}=0$ as an example).

After a first card transmission burst during the tracking of the PLL 505 (as controlled by TrackField=1), the phase error sampling unit 720 again samples the output signal 518 of the PFD 510. As an option, this is repeated N times, respectively, at the ends of the N first bursts. The phase offset computation unit 730 averages out these N samples of the PFD output, and stores it ($\Phi 1_{,avg}$, $\Phi 1_{,avg}=\Delta\Phi$ as an example).

The phase offset computation unit 730 calculates $\Phi\text{off}=\Phi 1_{,avg}-\Phi 0_{,avg}$ ($\Phi\text{off}=\Delta\Phi$ in this example).

Figure 8:
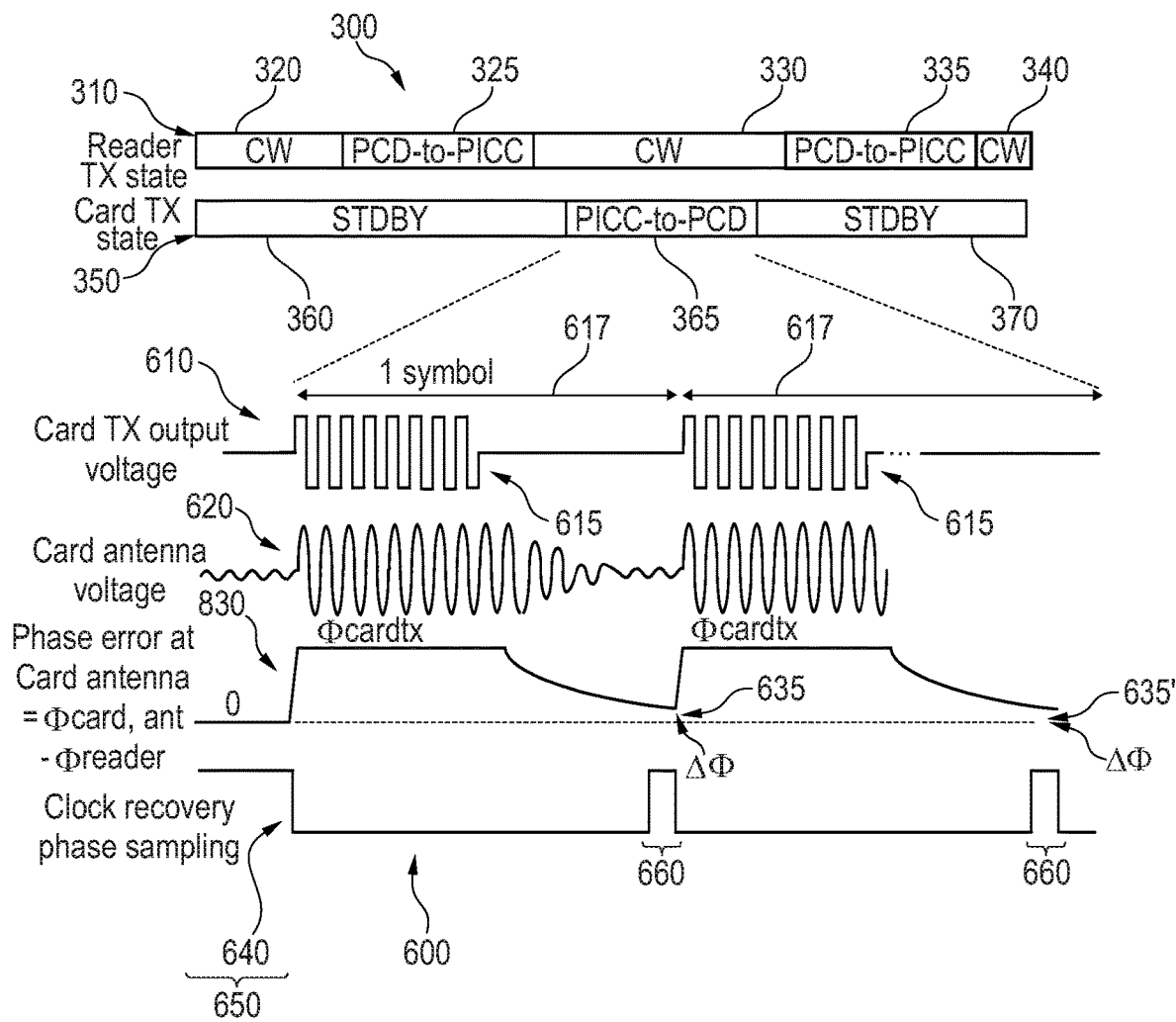
FIG. 8 shows a schematic chronogram of a card clock recovery method according to the present disclosure, with removal of the matching network memory effect, wherein a phase error of the clock recovery principle is compensated.

The phase subtractor unit 740 subtracts (Doff from the output 518 of the PFD 510 to thereby obtain a corrected phase error, and from now on provides the resulting corrected phase error to the loop filter 520. —In this way, the phase error caused by the memory effect in the matching network 475 is removed from the PLL control loop, resulting in an accurate and stable clock recovery phase, even during transmission bursts, as depicted in FIG. 8. The PLL 505 continues to regulate the phase of its oscillator 530 to the reader phase, without influence of the matching network 475. This leads to a stable and accurate card TX phase.

Now, with reference to FIGS. 4 and 7 to 10, exemplary embodiment examples according to the first, second, and third aspect of the present disclosure will be described, using the language of the appended claims and of the section "Summary of the present disclosure".

FIG. 4 shows a schematic block diagram of an NFC communication system 400 having an NFC reader 410 and a clock-less NFC card transceiver 450 having a card clock recovery system 480, 500 according to an exemplary embodiment of the present disclosure.

FIG. 4 shows the system context, in which the teaching of the present disclosure is implemented. The teaching of the present disclosure is implemented in a card clock recovery system 480 (as shown in FIG. 4) or 500 (as shown in FIG. 7), which is employed in a clock-less NFC card transceiver 250, 450 of an NFC communication system 200, 400.

The NFC transceiver 450 (see also 250 in FIG. 2) may be a clock-less transceiver (see 250 in FIG. 2). Alternatively or in addition, the NFC transceiver 450 may be an NFC transceiver 250, 450 that does not have a reference clock unit 190 or an oscillatory crystal 190 (see FIG. 1).

The NFC card transceiver 150, 450 is intended to be used in communication with an NFC reader 110, 410. As shown in FIG. 4, the NFC transceiver 450 has a card antenna 490, a card matching network 475, a card receiver 470, a card transmission controller 460, a card transmission driver 465, a card clock recovery system 480 (see also 500 in FIG. 7) according to an embodiment example of the present disclosure, and a card clock generation unit 485.

The card matching network 475 is coupled to the card antenna 490, and is configured to output an RX output 476 corresponding to a matching network output generated during a receiving mode of the NFC transceiver 450, for example while the NFC transceiver 450 receives a continuous wave, CW, emission 320, 330, 340 from an NFC reader 410, as a receiver input, RX, signal 472. The card matching network 475 is further configured to receive a transmission driver output, TX, signal 467, and to provide a matching network output signal 477 generated during a transmission mode of the NFC transceiver.

The card receiver 470 is configured to receive the RX output 476 provided by the card matching network 475, and to receive a receiver clock signal 486 from the card clock generation unit 485. The card transmission controller 460 is configured to output a card transmission control signal 462. The card transmission driver 465 is configured to receive the card transmission control signal 462, to receive a transmission clock signal 487, and to provide a TX driver output signal 467 to the card matching network 475.

The card clock recovery system 480 (see 500 in FIG. 7) is configured to either receive the RX signal 472 during a receiving mode of the NFC transceiver 450 or to receive the matching network output signal 477 during a transmission mode of the NFC transceiver 450, and to provide a card clock generation control signal 482 to the card clock generation unit 485. The card clock generation unit 485 is configured to receive the card clock generation control signal 482 from the card clock recovery system 480 (see 500 in FIG. 7), to provide the receiver clock signal 486 to the card receiver 470, and to provide the transmission clock signal 487 to the card transmission driver 465.

FIG. 7 shows a schematic block diagram of a card clock recovery system 480, 500, which has a phase offset correction unit 700 that is capable to remove the matching network memory effect, according to the present disclosure.

A card clock recovery system 500 (see also 480 in FIG. 4) is intended for use in an NFC card transceiver 450 (see also 250 in FIG. 2). The NFC card transceiver 450 is couplable to an NFC reader 410 (see also 110 in FIG. 1), to thereby form an NFC communication system 400. As shown in FIG. 7, the card clock recovery system 500 has a phase lock loop (505) having: a phase/frequency detector (PFD) 510, a loop filter 520, a controllable oscillator (CO) 530, and furthermore a phase offset correction unit 700 according to an embodiment example of the present disclosure.

The phase/frequency detector (PFD) 510 is configured to receive a reference signal 512 provided at an RX port 476 of a matching network 475 during a receiving mode of the NFC transceiver 450 or to receive a reference signal provided at the RX port 476 of the matching network 475 during a transmission mode of the NFC transceiver 450. The PDF 510 is further configured to receive, via a loop feedback line 536, a loop feedback signal 538, and to provide, at its phase error output 516, a phase error signal 518. The latter (phase error signal 518) represents a phase difference between the reference signal 512 and the loop feedback signal 538.

The loop filter 520 is configured to receive a corrected phase error signal 722 that is derived from the phase error signal 518, and to provide a filtered phase error signal 526. The loop filter 520 is configured to integrate, over time, the received corrected phase error signal 722 to thereby generate the provided filtered corrected phase error signal 526.

The controllable oscillator (CO) 530, is configured to receive the filtered corrected phase error signal 526, as a commanding control input signal, and to provide a controlled frequency output signal 534. The latter, i.e. the controlled frequency output signal 534, is provided as the card clock generation control signal 539 to the card clock generation unit 485 of the NFC card transceiver 450, and as the loop feedback signal 538, via the loop feedback line 536, to the PFD 510 as its feedback input. The controllable oscillator 530 may be implemented as a digitally controlled oscillator (DCO) or as a voltage controlled oscillator (VCO).

The phase lock loop 505 further may have, a feedback divider 540 provided in the loop feedback line 536. The feedback divider 540 may be configured to divide the frequency of the loop feedback signal 538.

According to embodiment examples of the present disclosure, the card clock recovery system 500 further has a phase offset correction unit 700. The phase offset correction unit 700 is configured to receive the phase error signal 518 provided by the PFD 510 and to provide the corrected phase error signal 756 to the loop filter 520. The phase offset correction unit 700 has at least: a phase error sampling unit 720, a phase offset computation unit 730, and a phase subtractor unit 740.

The phase error sampling unit 720 is configured to receive the phase error signal 518, 722, to sample one or more phase error signals 722 at one or more first 655 and at one or more second 665 discrete points in time, and to provide one or more sampled phase error signals 724 sampled at the one or more first 655 and the one or more second 665 discrete points in time.

The phase offset computation unit 730 is configured to receive the one or more sampled phase error signals 724 sampled at the one or more first discrete points 655 in time and at the one or more second discrete points 665 in time, to compute a phase offset signal 734 that corresponds to a difference between at least one sampled phase error signal sampled at a second discrete point 665 in time and at least one sampled phase error signal sampled at a first discrete point 655 in time, and to provide the phase offset signal 734.

The one or more first discrete points 655 in time (indicated in the signal traces 630 in FIGS. 6 and 830 in FIG. 8) are while the NFC card transceiver 450 operates in a receiving mode, or while the card transceiver 450 receives a continuous wave, CW, emission 330 from an NFC reader 110; 410, to which the NFC transceiver 450 is coupled, during a transmission mode of the card transceiver. The one or more second discrete points 660 in time (also indicated in the signal traces 630 in FIGS. 6 and 830 in FIG. 8) are while the NFC card transceiver 450 operates in a transmitting mode and towards the ends of respective symbol transmission periods 617.

The phase subtractor unit 740 is configured to receive the phase error signal 518, 722 provided by the PFD 510, to receive the phase offset signal 734 provided by the phase offset computation unit 730, to subtract the phase error signal 722 from the phase offset signal 734 to thereby generate the corrected phase error signal 746, and to provide the corrected phase error signal 746, namely to the loop filter 520.

In an embodiment example, the phase offset computation unit 730 may be configured (i) to store a plurality of first phase error signals sampled at plural first discrete points 650 in time, to compute a first average ($\Phi 0_{,avg}$), out of these stored first phase error signals sampled at plural first discrete points 655 in time, and to store the first average ($\Phi 0_{,avg}$). The phase offset computation unit 730 may further be configured (ii) to store a plurality of second phase error signals sampled at plural second discrete points 665 in time, to compute a second average, $\Phi 1_{,avg}$, out of these stored second phase error signals sampled at plural second discrete points in time, and to store the second average $\Phi 1_{,avg}$. Moreover, the phase offset computation unit 730 may further be configured (iii) to compute a difference, for example $\Delta\Phi$, between the second average, $\Phi 1_{,avg}$, and the first average, $\Phi 0_{,avg}$, and to provide this difference ($\Delta\Phi=\Phi 1_{,avg},-\Phi 0_{,avg}$) as the phase offset signal 734, namely to the phase subtractor unit 740.

As shown in FIG. 7, the phase offset computation unit 730 further has a phase offset finite state machine 710, which is configured to output a first state control signal 711, a second state control signal 712, and a third state control signal 713. The first state control signal 711 is to be received by the phase error sampling unit 720 for controlling (a) the timing of the one or more first discrete points 655 in time and (b) the timing of the one or more second discrete points 665 in time. The second state control signal 712 is to be received by the phase offset computation unit 730 for (c) controlling the timing of the storing of the one or more first phase error signals sampled at the one or more first discrete points 655 in time, and for example the computing of the first average, $\Phi 0_{,avg}$, out of these stored first phase error signals, for (d) controlling the timing of the storing of the one or more second phase error signals sampled at the one or more second discrete points 665 in time, and for example the computing of the second average, $\Phi 1_{,avg}$, out of these stored second phase error signals, and for (e) controlling the timing of the computing of the difference, $\Delta\Phi$, between the second average, $\Phi 1_{,avg}$, and the first average, $\Phi 0_{,avg}$.

As further shown in FIG. 7, the phase offset finite state machine 710 has: a first control signal input 715, a second control signal input 716, and a third control signal input 717.

The first control signal input 715 (see also the control signal 910, named Tx_active in FIG. 9) is configured to receive a first control signal 910 that controls an activation of a card transmitter driver 465. The second control signal input 716 (see also the control signal 920, named Tx_env in FIG. 9) is configured to receive a second control signal 920 that controls an activation period 617 of the modulation of the card transmitter driver 465 for generating a modulated output voltage signal that represents an encoded symbol 615 to be transmitted by the card transmitter 460, 465.

The third control signal input 717 (see also the control signal 940, named TrackField) is configured to receive a third control signal 940 that controls the timing of the sampling of the one or more first phase error signals sampled at the one or more first discrete points 655 in time, and for example the computing of the first average, $\Phi 0_{,avg}$, of these stored first phase error signals, and the timing of the sampling of the one or more second phase error signals sampled at the one or more second discrete points 665 in time, and for example the computing of the second average, $\Phi 1_{,avg}$, of these stored second phase error signals.

The third state control signal 713 (see also the control signal 980 in FIG. 9, named Freeze_Osc) is input to the loop filter 520 and it causes a control such that the control input 532 of the CO 530 is frozen when the third state control signal 713 (i.e. the control signal 980) is set to be (or transitions from "FALSE" to) "TRUE". Later, when the phase correction has been determined and applied, i.e. when the phase offset (Doff has been subtracted from the phase error signal 518 output from the PFD 510, the phase lock loop 505 can track again the reference signal 472, 512, and correspondingly the control input 532 of the CO 530 can be unfrozen. This is then reflected by the third state control signal 713, Freeze_Osc, transitioning from "TRUE" back to "FALSE", refer to FIG. 9. When the third state control signal 713, Freeze_Osc, has been set back to "FALSE", the loop filter 520 returns to receive the corrected phase error signal 756, provides the filtered corrected phase error signal 526, and thereby commands the CO 530 to provide a controlled frequency output signal 534, which is regulated by the phase lock loop 505.

It is recalled that the one or more first discrete points 655 in time (see signal traces 630 and 830 in FIGS. 6 and 8) are while the NFC card transceiver 450 operates in a receiving mode, or while the card transceiver 450 receives a continuous wave, CW, emission 330 from an NFC reader 110; 410, to which the NFC transceiver 450 is coupled, during a transmission mode of the card transceiver. The one or more second discrete points 665 in time (also refer to signal traces 630 and 830 in FIGS. 6 and 8) are while the NFC card transceiver 450 operates in a transmitting mode and towards the ends of respective symbol transmission periods 617.

FIG. 8 shows a schematic chronogram of a card clock recovery method 1000 according to the present disclosure, with removal of the matching network memory effect, wherein a phase error (see $\Delta\Phi$ at 635) of the clock recovery principle is compensated.

The chronogram of FIG. 8 differs from the chronogram of FIG. 6 namely in that the trace of the signal 830 differs from the trace of the signal 630. In the trace of the signal 630 in FIG. 6, as explained above and due to the matching network memory effect, the phase error at the end of a transmission burst period 617 related to the transmission of a signal 615 increases from one period 617 to the next period 617; refer in FIG. 6 to the phase error $\Delta\Phi$ at the end of the first symbol burst period 617, to the phase error 2*$\Delta\Phi$ at the end of the second symbol burst period 617, and so on in the trace 630. In the trace of the signal 830 in FIG. 8, as explained above and due to the compensation by the phase offset correction unit 700 of the matching network memory effect, the phase errors at the end of a transmission burst periods 617 related to the transmission of signals 615 does not increase from one period 617 to the next 617, but rather remains small at $\Delta\Phi$; refer in FIG. 8 to the phase errors $\Delta\Phi$ in the trace 830.

Figure 9:
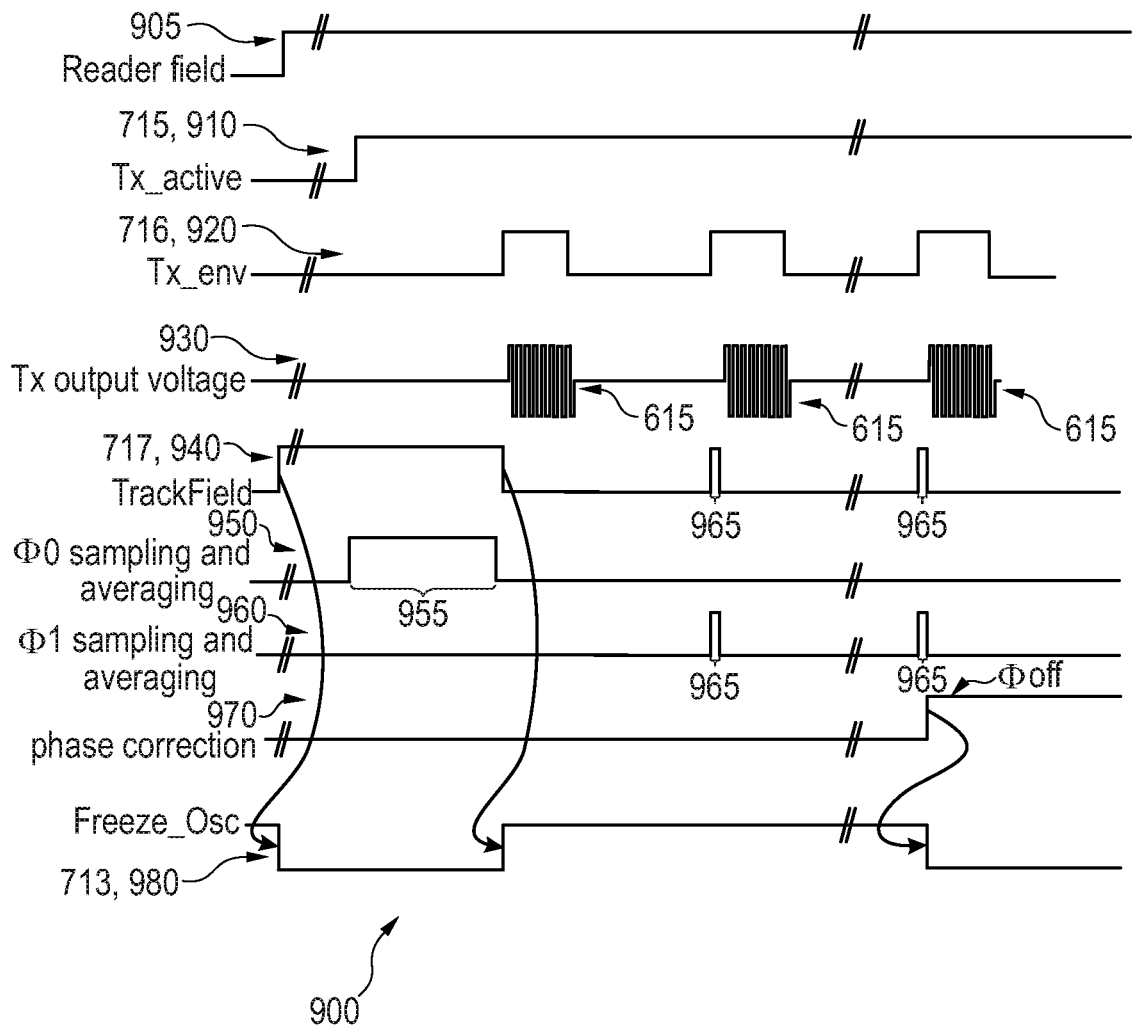
FIG. 9 shows a schematic chronogram of the control signals used in a card clock recovery system according to the present disclosure, with removal of the matching network memory effect.

FIG. 9 shows a schematic chronogram of the control signals (see 715, 716, 717 in FIG. 7, 910, 920, 930, 940, 980 in FIG. 9) used in a card clock recovery system 500 (see FIG. 7) according to the present disclosure, with removal of the matching network memory effect.

Trace 910 is the trace of the first control signal 715, which is herein referred to as "Tx_active" and which is input to the phase offset finite state machine 710 as shown in FIG. 7. This first control signal "Tx_active" is set during the whole period of transmission of PICC-to-PCD frames, see reference numeral 365 in the trace 350 representing the card transmission (TX) state in FIGS. 6 and 8. "Tx_active" is set (for example to "High") irrespective of whether the carrier signal is transmitted (as indicated by the second control signal 716 ("Tx_env") being set in trace 920) or not ("Tx_env" not being set in trace 920).

Trace 920 is the trace of the second control signal 716, which is herein referred to as "Tx_env" and which is input to the phase offset finite state machine 710 as shown in FIG. 7. This second control signal "Tx_env" represents the modulation signal, and it is set when the carrier signal is transmitted (as indicated by the second control signal 716 ("Tx_env") being set in trace 920).

Trace 940 is the trace of the third control signal 717, which is herein referred to as "TrackField" and which is input to the phase offset finite state machine 710 as shown in FIG. 7. This third control signal "TrackField" triggers the sampling (or acquisition) of the phase error output signal 518 provided at the output of the PFD 510. The control signal "TrackField" triggers the sampling of the phase error output signal 518 both over the first points 650 in time (see FIGS. 6 and 8, trace 640 "clock recovery phase sampling") (or see at 950 in the traces 940 and 650 in FIG. 9), i.e. during the receive operation of the NFC transceiver 450, and also over the second points 660 in time (see FIGS. 6 and 8, trace 640) (or see at 960 in the traces 940 and 660 in FIG. 9), i.e. during the transmission operation of the NFC transceiver 450, towards the end of a transmission burst, when the impact of the transmission on the monitored external field (reader field) is minimum, or in other words, when the damping of the oscillation in a transmission burst caused by the transmission is at maximum. The second points 660 in time in FIGS. 6 and 8 (or points 960 in time in FIG. 9) are set long enough after a carrier signal was generated (for the transmission of a symbol 615 in FIGS. 6 and 8), and before the start of the next transmission burst (or carrier transmission). The triggering of the sampling of the phase error output signal 518 over the second points 660, 960 in time is implemented by the sampling and averaging of the phase.

Trace 950 is the trace of controlling the sampling of the PFD output 518 and averaging during first points 650, 950 in time, i.e. during a receive operation of the NFC card transceiver, thereby yielding the first average ($\Phi 0_{,avg}$) out of the first phase error signals sampled at plural first discrete points 650, 950 in time.

Trace 960 is the trace of controlling the sampling of the PFD output 518 and averaging during second points 660, 960 in time, i.e. during a transmission operation of the NFC card transceiver at the end of a TX transmission burst, thereby yielding the second average ($\Phi 1_{,avg}$) out of the second phase error signals sampled at plural second discrete points 660, 960 in time.

Trace 970 is the trace of controlling the phase correction, when the phase offset (Doff is subtracted from the phase error signal 518 output from the PFD 510, as performed in the phase subtractor unit 740. The event of applying the phase correction, i.e. subtracting the phase offset $\Phi$off from the phase error signal 518 output from the PFD 510, triggers a transition of the third state control signal 713, also named Freeze_Osc, from "TRUE" to "FALSE", as explained in the following.

Trace 980 is the trace of controlling the control input 532 of the controllable oscillator 530 using the third state control signal 713, also named Freeze_Osc, output by the phase offset finite state machine 710. With reference also to FIG. 7, the control of this fourth control signal 980 (i.e. the third state control signal 713, Freeze_Osc) on the control input 532 of the CO 530 is such that the control input 532 of the CO 530 is frozen when the control signal 980, i.e. the third state control signal 713, Freeze_Osc, is set (or transitions from "FALSE") to "TRUE". Then, when the phase correction has been applied, i.e. when the phase offset (Doff has been subtracted from the phase error signal 518 output from the PFD 510, the phase lock loop 505 can track again the reference signal 472, 512, and correspondingly the control input 532 of the CO 530 can be unfrozen, which is set by the third state control signal 713, Freeze_Osc, transitioning to "FALSE". Further with reference to FIG. 7, when the third state control signal 713, Freeze_Osc, has been set back to "FALSE", the loop filter 520 returns to receive the corrected phase error signal 756, provides the filtered corrected phase error signal 526, and thereby commands the CO 530 to provide a controlled frequency output signal 534, which is regulated by the phase lock loop 505.

Figure 10:
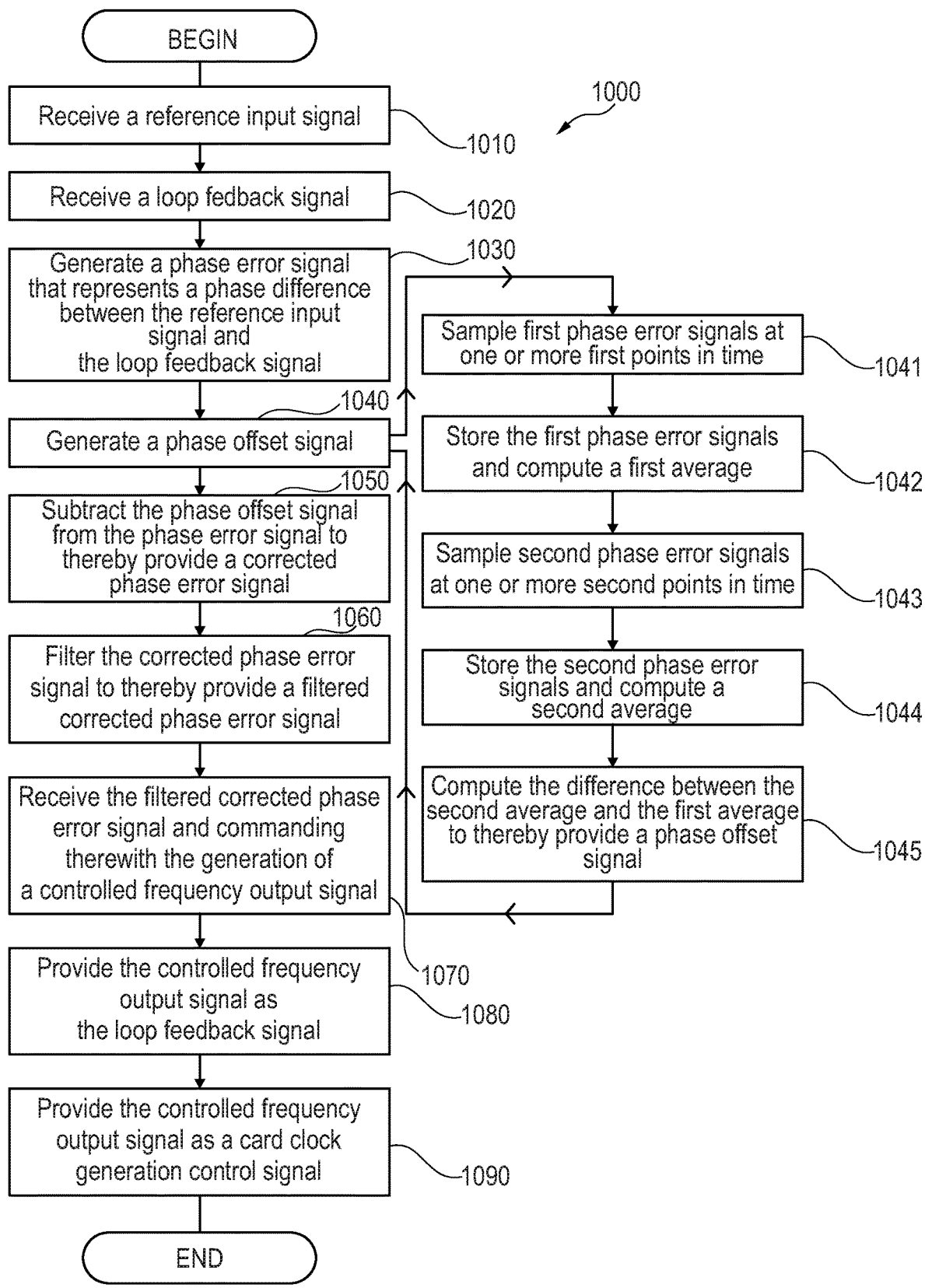
FIG. 10 shows a flow diagram of a method of correcting a signal phase of a card clock generation control signal, with removal of the matching network memory effect, according to the present disclosure.

FIG. 10 shows a flow diagram of a method 1000 of correcting a signal phase of a card clock generation control signal 539, with removal of the matching network memory effect, according to the present disclosure.

The method 1000 aims to correct a signal phase of a card clock generation control signal 482, 539 for the influence of the matching network memory effect. The card clock generation control signal 482, 539 is generated as an output of a card clock recovery system 480, 500 of an NFC transceiver 450 and is configured for being received by a card clock generation unit 485 of the NFC transceiver 450. As shown in FIG. 7, the card clock recovery system 500 has a phase/frequency detector (PFD) 510, a loop filter 520, a controlled oscillator (CO) 530, and a phase offset correction unit 700, which has a phase offset finite state machine 710, a phase error sampling unit 720, a phase offset computation unit 730, and a phase subtractor unit 740.

With reference to FIG. 10, the method 1000 begins at step 1010 of receiving, at a reference input of the PFD 510, a reference input signal 512. The method proceeds to step 1020 of receiving, at a feedback input of the PFD 510, a loop feedback signal 514. The method further proceeds to step 1030 of generating, at an output of the PFD 510, a phase error signal 518, 722 that represents a phase difference between the reference input signal 512 and the loop feedback signal 514. The steps 1010, 1020 and 1030 are performed both during the first points 650 in time, i.e. while the NFC transceiver operates in a receiving mode, and during the second points 660 in time, i.e. while the NFC transceiver operates in a transmission mode.

Also in the description of the method 1000, it is recalled that the one or more first discrete points 650, 950 in time (indicated in the signal traces 630 in FIG. 6, 830 in FIGS. 8, and 940, 950 in FIG. 9) are while the NFC card transceiver 450 operates in a receiving mode and receives a continuous wave, CW, emission 330 from an NFC reader 110; 410, to which the NFC transceiver 450 is coupled. The one or more second discrete points 660 in time (also indicated in the signal traces 630 in FIG. 6, 830 in FIGS. 8, and 940, 950 in FIG. 9) are while the NFC card transceiver 450 operates in a transmitting mode and towards the ends of respective symbol transmission periods 617.

Then, the method proceeds to step 1040 of generating, by the phase offset correction unit 700, a phase offset signal 714 and subtracting the phase error signal 518, 722 from the phase offset signal 714 to thereby provide a corrected phase signal 746. The step 1040 comprises, and is detailed by, the steps 1041 to 1045, which are described in the following.

The step 1040 comprises step 1041 of sampling the phase error signal 518, 722, by the phase error sampling unit 720, at one or more first discrete points 650 in time. Step 1040 further comprises step 1042 of storing a plurality of first phase error signals sampled at plural first discrete points 650 in time, computing a first average ($\Phi 0_{,avg}$) out of these stored first phase error signals sampled at plural first discrete points 650 in time, and storing the first average ($\Phi 0_{,avg}$). The method proceeds to step 1043, which is also comprised in step 1040, involving sampling the phase error signal 518, 722, by the phase error sampling unit 720, at one or more second discrete points 660 in time. Step 1040 further comprises step 1044 of storing a plurality of second phase error signals sampled at plural second discrete points 660 in time, computing a second average ($\Phi 1_{,avg}$) out of these stored second phase error signals sampled at plural second discrete points 660 in time, and storing the second average ($\Phi 1_{,avg}$). The method proceeds to the step 1045 of computing, by the phase offset computation unit 730, a phase offset signal 714 that is obtained as a difference between a phase error signal sampled at a second discrete point 660 in time and a phase error signal sampled at a first discrete point 650 in time. Step 1045 may also comprise computing a difference ($\Delta \Phi$) between the second average ($\Phi 1_{,avg}$) and the first average ($\Phi 0_{,avg}$), and providing this difference as the phase offset signal ($\Delta \Phi$off), to the phase subtractor unit 740.

The method 1000 further proceeds to step 1050 of subtracting, by the phase subtractor unit 740, the phase offset signal 714 from the phase error signal 518, 722, so as to thereby provide the corrected phase error signal 756, to the loop filter 520. This is followed by a step (not shown) of receiving, by the loop filter 520, the corrected phase error signal 756, and by the step 1060 of filtering, in the loop filter 520, the corrected phase error signal 756 to thereby provide a filtered corrected phase error signal 526.

The method 1000 then proceeds further to step 1070 of receiving, by the controllable oscillator 530, the filtered corrected phase error signal 526, commanding therewith the controllable oscillator 530 to thereby provide, by the controlled oscillator 530, a controlled frequency output signal 534. This is followed both by the step 1080 of providing the controlled frequency output signal 534 as the loop feedback signal 514, 538 to the PFD 510 (feedback signal 514), and by the step 1090 of providing the controlled frequency output signal 534 as the signal phase corrected card clock generation control signal 482, 539, to the card clock generation unit 485 of the NFC transceiver 450.

While the following is not shown in FIG. 10, the method 1000 further comprises steps performed in the phase offset finite state machine 710, as follows.

The method 1000 may comprise a step of providing, by the phase offset finite state machine 710, a first state control signal 711 to the phase error sampling unit 920 for controlling (a) the timing of the one or more first discrete points 655 in time and (b) the timing of the one or more second discrete points 665 in time. In addition, the method may comprise a step of providing, by the phase offset finite state machine 710, a second state control signal 712 to the phase offset computation unit 730 for (c) controlling the timing of the storing of the first phase error signals sampled at the one or more first discrete points 655 in time, and for example the computing of the first average ($\Phi 0_{,avg}$) out of these stored first phase error signals, for (d) controlling the timing of the storing of the one or more second phase error signals sampled at the one or more second discrete points 665 in time, and for example the computing of the second average ($\Phi 1_{,avg}$) out of these stored second phase error signals, and for (e) controlling the timing of the computing of the difference between the second phase error signal and the first phase error signal, or for example the difference ($\Delta \Phi$) between the second average ($\Phi 1_{,avg}$) and the first average ($\Phi 0_{,avg}$).

The method 1000 may further comprise, in the phase offset finite state machine 710, a step of receiving, at a first control signal input 715 of the finite state machine 710, a first control signal 910 (elsewhere referred to as Tx_active) that controls an activation of a card transmitter driver 785, namely during the transmission by the NFC card transceiver 450 of all the transmitted PICC-to-PCD frames (see 365 in card Tx state 350 in FIG. 8). In addition, the method 1000 may comprise, in the phase offset finite state machine 710, a step of receiving, at a second control signal input 716 of the finite state machine 710, a second control signal 920 (elsewhere referred to as Tx_env) that controls an activation period 617 of the modulation of the card transmitter driver 465 for generating a modulated output voltage signal that represents an encoded symbol 615 to be transmitted by the card transmitter 460, 465. Still further, the method 1000 may comprise, in the phase offset finite state machine 710, a step of receiving, at a third control signal input 717 of the finite state machine 710, a third control signal 940 (elsewhere referred to as TrackField) that controls the timing of the sampling of the one or more first phase error signals sampled at one or more first discrete points 655 in time, and the computing of the first average ($\Phi 0_{,avg}$) of these stored first phase error signals, and the timing of the sampling of the one or more second phase error signals sampled at one or more second discrete points 665 in time, and the computing of the second average ($\Phi 1_{,avg}$) of these stored second phase error signals. Still further, the method 1000 may comprise, in the phase offset finite state machine 710, a step of outputting, as a third state control signal 713 of the finite state machine 710, a control signal 980 (elsewhere referred to as Freeze_Osc), which is to be received by the loop filter 520 for controlling the control input 532 of the controllable oscillator 530 such that the control input 532 is frozen when the third state control signal 713 is set to be "TRUE".

In this specification, example embodiments have been presented in terms of a selected set of details. However, a person of ordinary skill in the art would understand that many other example embodiments may be practiced which include a different selected set of these details. It is intended that the following claims cover all possible example embodiments.

Supplementary, it is to be noted that "having" or "comprising" does not exclude other elements or steps, and that "a" or "an" does not exclude a plurality. In addition, it is to be noted that features or steps, which have been described above with reference to one of the above embodiment examples, may also be used in combination with other features or steps of other embodiment examples that have been described above. Reference numerals in the claims are not to be construed as limitations.

LIST OF REFERENCE NUMERALS

100 NFC communication system
110 NFC reader
120 reader system
130 reader matching network 140 reader antenna
150 NFC transceiver
160 card transceiver system
170 card matching network
180 card antenna
190 reference clock and/or crystal
250 clock-less NFC transceiver device
260 clock-less card transceiver system
300 NFC transaction example
310 reader TX state
320 transmitting unmodulated field (or CW field)
325 PCD-to-PICC communication
330 transmitting unmodulated field (or CW field)
335 PCD-to-PICC communication
340 transmitting unmodulated field (or CW field)
350 card TX state
360 standby state
365 PICC-to-PCD communication
370 standby state
400 NFC communication system
410 NFC reader
420 reader TX
430 reader RX
435 reader matching network
440 reader antenna
450 NFC transceiver
460 card TX control
462 card transmission control signal
465 card TX driver
467 TX output
470 card receiver, RX
472 RX input signal
475 reader matching network
476 RX port
477 TX port
478 antenna port
480 card clock recovery system
482 card clock generation control signal
485 card clock generation unit
486 receiver clock signal
487 transmission clock signal
490 reader antenna
500 card clock recovery system
505 phase lock loop
510 phase/frequency detector
512 reference input signal
514 loop feedback input signal
516 phase error output
518 phase error signal
520 loop filter
522 filter phase input
526 filtered corrected phase error signal
530 controlled oscillator
532 control input
534 controlled frequency output signal
536 loop feedback line
538 loop feedback signal
539 card clock generation control signal
540 feedback divider
600 card clock recovery principle chronogram
610 card TX output voltage
615 encoded symbol
617 activation period
620 card antenna voltage
630 phase error at card antenna
635, 635' phase error
640 clock recovery phase sampling
650 first discrete points in time
660 second discrete points in time
700 phase offset correction unit
710 phase offset finite state machine
711 first state control signal
712 second state control signal
713 third state control signal (Freeze_Osc)
715 first control signal (TX_active)
716 second control signal (TX_env)
717 third control signal (TrackField)
720 phase error sampling unit
721 phase error input
722 phase error signal
723 sampled phase error output
724 sampled phase error signal
730 phase offset computation unit
732 sampled phase error signal
740 phase subtractor unit
741 first phase input
742 phase error signal
743 second phase input
744 phase offset signal
755 corrected phase output
756 corrected phase error signal
830 corrected phase error at card antenna
835 corrected phase error
900 control signal chronogram
905 (trace of) reader field signal
910 (trace of) first control signal (TX_active)
920 (trace of) second control signal (TX_env)
930 (trace of) fourth control signal (Tx output voltage)
940 (trace of) third control signal (TrackField)
950 control sampling and averaging during first points in time
955 first points in time
960 control sampling and averaging during second points in time
965 second points in time
970 control phase correction
980 (trace of) fourth control signal (Freeze_Osc)

The invention claimed is:

1. A card clock recovery system for use in a Near Field Communication, NFC, card transceiver, wherein the NFC card transceiver is couplable to an NFC reader, wherein the card clock recovery system has:
a phase lock loop having:
a phase/frequency detector, PFD, which is configured to receive a reference signal provided at an RX port of a matching network during a receiving mode of the NFC transceiver or to receive a reference signal provided at the RX port of the matching network during a transmission mode of the NFC transceiver, to receive, via a loop feedback line, a loop feedback signal, and to provide a phase error signal that represents a phase difference between the reference signal and the loop feedback signal;
a loop filter configured to receive a corrected phase error signal that is derived from the phase error signal, and to provide a filtered corrected phase error signal; and
a controllable oscillator, CO, which is configured to receive the filtered corrected phase error signal and to provide a controlled frequency output signal, which is provided as the card clock generation control signal to a card clock generation unit of an NFC card transceiver, and as the loop feedback signal, via the loop feedback line, to the PFD;

wherein the card clock recovery system further has:
a phase offset correction circuit, which is configured to receive the phase error signal provided by the PFD and to provide the corrected phase error signal to the loop filter, wherein the phase offset correction circuit comprises:
a phase error sampling circuit, which is configured to receive the phase error signal, to sample one or more phase error signals at one or more first and at one or more second discrete points in time, and to provide one or more sampled phase error signals sampled at the one or more first and the one or more second discrete points in time;
a phase offset computation circuit, which is configured to receive the one or more sampled phase error signals sampled at the one or more first and at the one or more second discrete points in time, to compute a phase offset signal that corresponds to a difference between at least one sampled phase error signal sampled at a second discrete point in time and at least one sampled phase error signal sampled at a first discrete point in time, and to provide the phase offset signal; and
a phase subtractor circuit, which is configured to receive the phase error signal provided by the PFD, to receive the phase offset signal provided by the phase offset computation circuit, to subtract the phase error signal from the phase offset signal to thereby generate the corrected phase error signal, and to provide the corrected phase error signal to the loop filter.

2. The card clock recovery system according to claim 1, wherein the phase offset computation circuit is configured to
store a plurality of first phase error signals sampled at plural first discrete points in time, to compute a first average, $\Phi 0_{,avg}$, out of these stored first phase error signals sampled at plural first discrete points in time, and to store the first average, $\Phi 0_{,avg}$;
store a plurality of second phase error signals sampled at plural second discrete points in time, to compute a second average, $\Phi 1_{,avg}$, out of these stored second phase error signals sampled at plural second discrete points in time, and to store the second average, $\Phi 1_{,avg}$; and
compute a difference, $\Delta \Phi$, between the second average, $\Phi 1_{,avg}$, and the first average, $\Phi 0_{,avg}$, and to provide the difference, $\Delta \Phi$, as the phase offset signal to the phase subtractor circuit.

3. The card clock recovery system according to claim 2, wherein the phase offset computation circuit further has:
a phase offset finite state machine, which is configured to output
a first state control signal to be received by the phase error sampling circuit for controlling the timing of the one or more first discrete points in time, and the timing of the one or more second discrete points in time;
a second state control signal to be received by the phase offset computation circuit for controlling the timing of the storing of the one or more first phase error signals sampled at the one or more first discrete points in time, and the computing of the first average, $\Phi 0_{,avg}$, out of the stored first phase error signals, for controlling the timing of the storing of the one or more second phase error signals sampled at the one or more second discrete points in time, and the computing of the second average, $\Phi 1_{,avg}$, out of the stored second phase error signals, and for controlling the timing of the computing of the difference, $\Delta \Phi$, between the second average, $\Phi 1_{,avg}$, and the first average, $\Phi 0_{,avg}$; and
a third state control signal to be received by the loop filter for controlling a control input of the controlled oscillator such that the control input of the controlled oscillator is frozen when third state control signal is set to be TRUE.

4. The card clock recovery system according to claim 3, wherein the phase offset finite state machine has:
a first control signal input configured to receive a first control signal that controls an activation of a card transmitter driver;
a second control signal input configured to receive a second control signal that controls an activation period of the modulation of the card transmitter driver for generating a modulated output voltage signal that represents an encoded symbol to be transmitted by the card transmitter; and
a third control signal input configured to receive a third control signal that controls the timing of the sampling of the one or more first phase error signals sampled at the one or more first discrete points in time, and the computing of the first average, $\Phi 0_{,avg}$, of these stored first phase error signals, and the timing of the sampling of the one or more second phase error signals sampled at the one or more second discrete points in time, and the computing of the second average, $\Phi 1_{,avg}$, of these stored second phase error signals.

5. The card clock recovery system according to claim 3, further having:
a fourth control signal, which corresponds to the third state control signal and is be received by the loop filter for controlling the control input of the CO, wherein the control input is frozen when the fourth control signal is set to be TRUE.

6. The card clock recovery system according to claim 3, wherein the one or more first discrete points in time are while the NFC card transceiver operates in a receiving mode, or while the card transceiver receives a continuous wave, CW, emission from an NFC reader, to which the NFC transceiver is coupled, during a transmission mode of the card transceiver; and
wherein the one or more second discrete points in time are while the NFC card transceiver operates in a transmitting mode and towards the ends of respective symbol transmission periods.

7. The card clock recovery system according to claim 1, having at least one of the following features:
the controllable oscillator is one of a digitally controlled oscillator, DCO, or a voltage controlled oscillator, VCO;
the phase lock loop further has, a feedback divider provided in the loop feedback line, wherein the feedback divider is configured to divide the frequency of the loop feedback signal;
the loop filter is configured either to integrate over time and to amplify by a proportionality factor, or to integrate over time, or to amplify by a proportionality factor, the received corrected phase signal to thereby generate the provided filtered corrected phase error signal.

8. An NFC card transceiver for use in communication with an NFC reader, wherein the NFC transceiver has a card antenna, a card matching network, a card receiver, a card transmission controller, a card transmission driver, a card clock recovery system according to claim 1, and a card clock generation circuit:

wherein the card matching network is coupled to the card antenna, is configured to output an receiver, RX, input signal at an RX port of the card matching network, which RX input signal is generated during a receiving mode of the NFC transceiver, while the NFC transceiver receives a continuous wave, CW, emission from an NFC reader, to receive a transmission, TX, output signal at a TX port of the card matching network, which TX output signal is generated during a transmission mode of the NFC transceiver;

wherein the card receiver is configured to receive the RX input signal provided at the RX port of the card matching network, and to receive a receiver clock signal from the card clock generation circuit;

wherein the card transmission controller is configured to output a card transmission control signal;

wherein the card transmission driver is configured to receive the card transmission control signal, to receive a transmission clock signal, and to provide the TX output signal to the TX port of the card matching network;

wherein the card clock recovery system is configured to either receive the RX input signal provided at the RX port during a receiving mode of the NFC transceiver or to receive the RX input signal during a transmission mode of the NFC transceiver, and to provide a card clock generation control signal to the card clock generation circuit; and wherein the card clock generation circuit is configured to receive the card clock generation control signal from the card clock recovery system, to provide the receiver clock signal to the card receiver, and to provide the transmission clock signal to the card transmission driver.

9. The NFC card transceiver according to claim 8, wherein the NFC transceiver is one of a clock-less transceiver or an NFC transceiver that does not have a reference clock circuit or an oscillatory crystal.

10. A method for correcting a signal phase of a card clock generation control signal, which is generated as an output of a card clock recovery system of an NFC transceiver and is configured for being received by a card clock generation unit of the NFC transceiver, wherein the card clock recovery system has a phase/frequency detector, PFD, a loop filter, a controllable oscillator, CO, and a phase offset correction unit, the phase offset correction unit comprises a phase error sampling unit, a phase offset computation unit, and a phase subtractor unit, and wherein the method comprises:

receiving, at a reference input of the PFD, a reference input signal;

receiving, at a feedback input of the PFD, a loop feedback signal;

generating, at an output of the PFD, a phase error signal that represents a phase difference between the reference input signal and the loop feedback signal;

sampling the phase error signal, by the phase error sampling unit, at one or more first discrete points in time and at one or more second discrete points in time;

computing, by the phase offset computation unit, a phase offset signal that is obtained as a difference between a phase error signal sampled at a second discrete point in time and a phase error signal sampled at a first discrete point in time; and subtracting, by the phase subtractor unit, the phase error signal from the phase offset signal so as to thereby provide the corrected phase error signal;

receiving, by the loop filter, the corrected phase error signal, filtering, in the loop filter, the corrected phase error signal to thereby provide a filtered corrected phase error signal;

receiving, by the CO, the filtered corrected phase error signal, commanding therewith the CO to thereby provide, by the CO, a controlled frequency output signal;

providing the controlled frequency output signal as the loop feedback signal to the PFD; and providing the controlled frequency output signal as a signal phase corrected card clock generation control signal, to the card clock generation unit of the NFC transceiver.

11. The method according to claim 10, further comprising, in the phase offset computation unit, storing a plurality of first phase error signals sampled at plural first discrete points in time, computing a first average, $\Phi 0_{,avg}$, out of these stored first phase error signals sampled at plural first discrete points in time, and storing the first average, $\Phi 0,avg$;

storing a plurality of second phase error signals sampled at plural second discrete points in time, computing a second average, $\Phi 1_{,avg}$, out of these stored second phase error signals sampled at plural second discrete points in time, and storing the second average, $\Phi 1,avg$; and computing a difference, $\Delta \Phi$, between the second average, $\Phi 1_{,avg}$, and the first average, $\Phi 0_{,avg}$, and providing the difference as the phase offset signal, to the phase subtractor unit.

12. The method according to claim 11, wherein the phase offset correction unit further has a phase offset finite state machine, and wherein the method further comprises:

providing, by the phase offset finite state machine, a first state control signal to the phase error sampling unit for controlling the timing of the one or more first discrete points in time and (b) the timing of the one or more second discrete points in time;

providing, by the phase offset finite state machine, a second state control signal to the phase offset computation unit for controlling the timing of the storing of the first phase error signals sampled at the one or more first discrete points in time, and the computing of the first average, $\Phi 0_{,avg}$, out of these stored first phase error signals, controlling the timing of the storing of the one or more second phase error signals sampled at the one or more second discrete points in time, and the computing of the second average, $\Phi 1_{,avg}$, out of these stored second phase error signals, and for controlling the timing of the computing of the difference between the second phase error signal and the first phase error signal, or the difference, $\Delta \Phi$, between the second average, $\Phi 1_{,avg}$, and the first average, $\Phi 0_{,avg}$; and providing, by the phase offset finite state machine, a third state control signal to be received by the loop filter for controlling a control input of the controlled oscillator such that the control input of the controlled oscillator is frozen when the third state control signal is set to be TRUE.

13. The method according to claim 12, further comprising, in the phase offset finite state machine:

receiving, at a first control signal input of the finite state machine, a first control signal that controls an activation of a card transmitter driver;

receiving, at a second control signal input of the finite state machine, a second control signal that controls an activation period of the modulation of the card transmitter driver for generating a modulated output voltage signal that represents an encoded symbol to be transmitted by the card transmitter; and receiving, at a third control signal input of the finite state machine, a third control signal that controls the timing of the sampling of the one or more first phase error signals sampled at one or more first discrete points in time, and the computing of the first average, $\Phi 0_{,avg}$, of these stored first phase error signals, and the timing of the sampling of the one or more second phase error signals sampled at one or more second discrete points in time, and for example the computing of the second average, $\Phi 1_{,avg}$, of these stored second phase error signals.

14. The method according to claim 13, further comprising:

controlling the control input of the controlled oscillator by a fourth control signal, which corresponds to the third state control signal and is to be received by the loop filter, wherein the control input of the controlled oscillator is frozen when the fourth control signal is set to be TRUE.

15. The method according to claim 12, wherein the one or more first discrete points in time are while the NFC transceiver operates in a receiving mode, or while the card transceiver receives a continuous wave, CW, emission from an NFC reader, to which the NFC transceiver is coupled, during a transmission mode of the card transceiver; and wherein the one or more second discrete points in time are while the NFC transceiver operates in a transmission mode and towards the ends of respective symbol transmission periods.

16. The method of claim 10, further comprising a computer program product having instructions stored in a machine-readable, non-transitional storage medium, which when executed on a data processing system control or execute the method.

* * * * *